(12) United States Patent
Ko et al.

(10) Patent No.: US 10,014,473 B2
(45) Date of Patent: Jul. 3, 2018

(54) CILIA-ASSISTED TRANSFER PRINTING OF ELECTRONIC DEVICES

(71) Applicant: GWANGJU INSTITUTE OF SCIENCE AND TECHNOLOGY, Gwangju (KR)

(72) Inventors: Heung Cho Ko, Gwangju (KR); Jongwon Yoon, Gwangju (KR); Yunkyung Jeong, Gunsan-si (KR); Seonggwang Yoo, Gwangju (KR); Heeje Kim, Gwangju (KR); Youngkyu Hwang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 11 days.

(21) Appl. No.: 15/288,420

(22) Filed: Oct. 7, 2016

(65) Prior Publication Data
US 2017/0162791 A1    Jun. 8, 2017

(30) Foreign Application Priority Data
Oct. 7, 2015   (KR) .................. 10-2015-0140859

(51) Int. Cl.
*H01L 51/00* (2006.01)
*B32B 5/02* (2006.01)
*B41M 5/382* (2006.01)

(52) U.S. Cl.
CPC .......... *H01L 51/0013* (2013.01); *B32B 5/024* (2013.01); *B41M 5/382* (2013.01); *H01L 51/0015* (2013.01); *H01L 51/0016* (2013.01); *H01L 51/0017* (2013.01); *H01L 51/0023* (2013.01); *H01L 51/0097* (2013.01); *B32B 2262/02* (2013.01)

(58) Field of Classification Search
CPC ............. H01L 51/0013; H01L 51/0015; H01L 51/0016
See application file for complete search history.

(56) References Cited

U.S. PATENT DOCUMENTS

| 8,097,926 B2* | 1/2012 | De Graff | A61B 1/05 257/419 |
| 2010/0002402 A1* | 1/2010 | Rogers | H01L 21/4867 361/749 |
| 2015/0237711 A1* | 8/2015 | Rogers | H05K 1/028 174/251 |

OTHER PUBLICATIONS

[Supportive Materials for Exception to Loss of Novelty] Heung Cho Ko, "Conformal printing of ultrathin structure for wearable electronic devices", 2015 Materials Research Society of Korea, May 14, 2015, 32 pages.

* cited by examiner

*Primary Examiner* — Errol Fernandes
(74) *Attorney, Agent, or Firm* — Hauptman Ham, LLP

(57) ABSTRACT

The present disclosure relates a method for transfer printing of an electronic device comprising: forming a sacrificial layer on a handling substrate; forming a protective layer on the sacrificial layer; forming a polymer substrate on the protective layer; forming a pattern on the polymer substrate, and forming a ciliary adhesive rod on the sides of the polymer substrate; forming a supportive layer on the polymer substrate on which the adhesive rod is formed; and removing the sacrificial layer and the protective layer, and transfer printing the electronic device onto an object to-be-printed, while dissolving the to supportive layer.

9 Claims, 33 Drawing Sheets

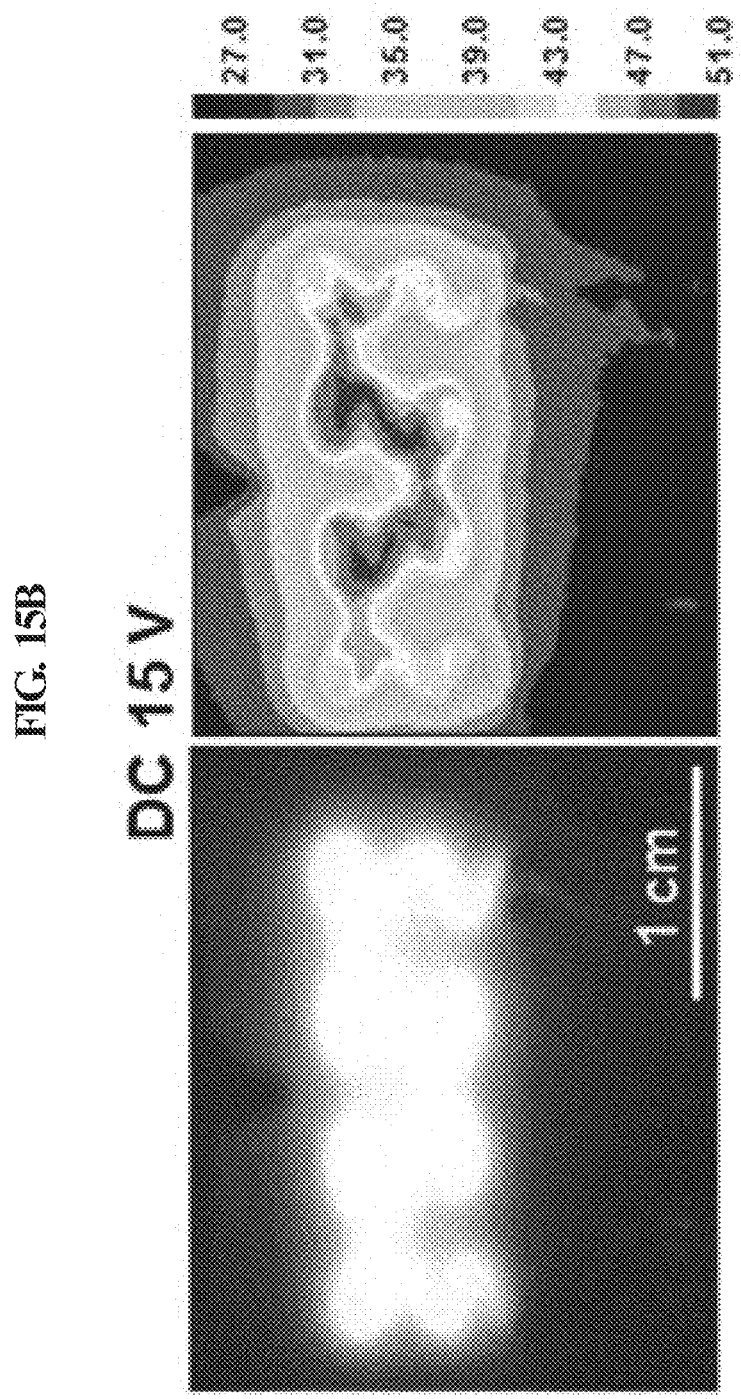

CILIA-ASSISTED TRANSFER PRINTING OF ELECTRONIC DEVICES

CROSS REFERENCE TO RELATED APPLICATION

This application claims the benefit of Korean Patent Application No. 10-2015-0140859, filed on Oct. 7, 2015, entitled "METHOD FOR DEVELOPMENT OF THE TRANSFER PRINTING USING CILIA STRUCTURE", which is hereby incorporated by reference in its entirety into this application.

BACKGROUND

1. Technical Field

The present disclosure relates to a method for transfer printing of an electronic device, and more particularly, to a method for transfer printing of an electronic device on unconventional complex surfaces with high stability.

2. Description of the Related Art

A recent development of various types of high-end flexible electronic devices offers users a high degree of freedom in keeping, carrying, using and discarding the devices, unlike conventional formulaic rigid type of devices.

Especially, lots of developments have been made to an electronic textile (e-textile), since it has unique advantages of using a woven texture that fits the human body comfortably, while deforming naturally upon movement, and being permeable to air and sweat. To develop an e-textile, two kinds of approaches are possible.

One is to create electronic threads and interlace them, as in the applications for, for example, energy saving/converting systems, light-emitting devices, and sensors, which do not require a plurality of high density pixel arrays or highly integrated circuits.

The other is to transfer printing of devices onto a ready-made textile, which is compatible with conventional wafer-based semiconductor process technology, and thus advantageously applicable to a variety of applications such as a complex logic circuit, an electrochromic device, and tactile sensors.

When conducting a transfer printing of electronic devices onto uneven substrates including textile, human skin, animal organs, and a leaf, substantial efforts have been devoted to accommodating an interface mismatch caused due to different geometries between the devices and the substrates.

Alternatively, a polymer substrate may be made as thin as possible to ensure its mechanical flexibility and suitable patterning for efficient conformal contact on the target surfaces. The device should be made robust to external deformations by using for example stretchable or bendable buckled or serpentine structures whereby electrodes for electrical interconnect may be spaced apart from the surfaces. In addition, the adhesion between a device and a complex substrate should be sufficiently strong. To this end, for example, glue may be used to promote the interfacial adhesion, but using too much glue on a substrate such as a textile may weaken the characteristic features of the substrate, e.g., air permeability.

As such, a need exists for a transfer printing technique that would allow for a conformal transfer of a device onto complex surfaces such as a textile.

Any discussions provided in the above related art are solely for the purpose of providing a better understanding of the background art to which the present disclosure relates. It is not to be taken as an admission that any or all of these matters discussed above form part of the prior art base or were common general knowledge in the art relevant to the present disclosure as it existed before the priority date.

SUMMARY

It is an object of the present disclosure to provide a method for transfer printing of an electronic device, which can minimize a mismatch at the interface while securing a sufficient contact area to bond two surfaces, and yet still have a sufficient adhesive strength with only a small amount of adhesive while at the same time maintaining the properties of the substrate, when transfer printing of electronic devices onto complex structured surfaces.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a method for transfer printing of an electronic device is provided that includes: forming a sacrificial layer on a handling substrate; forming a protective layer on the sacrificial layer; forming a polymer substrate on the protective layer; forming a pattern on the polymer substrate, and forming a ciliary adhesive rod on the sides of the polymer substrate; forming a supportive layer on the polymer substrate on which the adhesive rod is formed; and removing the sacrificial layer and the protective layer, and turning over and transfer printing the electronic device onto an object to-be-printed, while dissolving the supportive layer.

The handling substrate may be a glass or silicon substrate.

The sacrificial layer may include a germanium oxide (GeOx) that is water soluble.

The protective layer may include any one selected from a silicon oxide film, a thin metal film, and a polymer thin film, that is water insoluble.

The polymer substrate may include any one selected from a polyimide, a polyethylene terephthalate (PET), a polyether sulfone (PES), a polystyrene (PS), a polycarbonate (PC), a polyethylene naphthalate (PEN), a polyarylate (PAR), and SU-8 polymer.

The ciliary adhesive rod may be a straight or Y-shaped thin film.

The supportive layer may include a polymethyl methacrylate (PMMA).

The transfer printing may be conducted by introducing an adhesive solution of an adhesive mixed in an organic solvent.

The organic solvent may be a toluene, an acetone, or a hexane, and the adhesive may be a polydimethylsiloxane (PDMS) or polymethyl methacrylate (PMMA).

In accordance with another aspect of the present disclosure, a supporter for reliably transfer printing of flexible electronic devices on surfaces is provided that includes a handling substrate; a sacrificial layer formed on the handling substrate; a protective layer formed on the sacrificial layer; a polymer substrate formed on the protective layer, having patterns on which the electronic devices are to be formed, and having a ciliary adhesive rod formed on the sides thereof; and a supportive layer formed on the polymer substrate for supporting thereof.

The polymer substrate may include any one selected from a polyimide, a polyethylene terephthalate (PET), a polyether sulfone (PES), a polystyrene (PS), a polycarbonate (PC), a polyethylene naphthalate (PEN), a polyarylate (PAR), and SU-8 polymer.

The ciliary adhesive rod may be a straight or Y-shaped thin film.

In accordance with still another aspect of the present disclosure, a flexible electronic device which is transfer printed on the surface of an object to-be-printed is provided that includes a polymer substrate which is patterned so that the electronic device is formed on the surface thereof, and a ciliary adhesive rod is formed on the sides thereof, wherein the ciliary adhesive rod is close contact with the object to-be-printed.

The object to-be-printed may be a flexible material having bendable surface or a material having erratic and stepped surface.

The ciliary adhesive rod may be a straight or Y-shaped thin film.

The ciliary adhesive rod may be in close contact with the surface of the object to-be-printed by a mediated adhesive.

According to some embodiments of the present disclosure, a lateral cilia structure formed on the sides of the polymer substrate may be reliably attached to a surface having a complex morphologies including a textile using an adhesive solution of the adhesive mixed in an organic solvent.

In addition, the cilia structure having a high aspect ratio (e.g., long and thin) may reliably wrap the nearby threads of a textile, providing physically higher adhesive strengths.

Further, with the adhesive solution of the adhesive in an organic solvent, the polymer substrate on the supportive layer may be dissolved, and the adhesive may be formed around the cilia structure to provide a chemical adhesive strength that can afford a more reliable attachment to complex surfaces.

Moreover, the adhesive strength generated between the cilia structure and the adhesive formed around it allows for the devices to still sustain their positions on complex surfaces and to serve as dampers to release stress during mechanical deformations.

BRIEF DESCRIPTION OF DRAWINGS

FIGS. 15A to 15B show photographs and infrared thermal distributions for samples after applying a DC voltage of 15 V to a polymer substrate including electrodes transferred in a diagonal direction onto a textile, manufactured in Experimental Example 1.

DETAILED DESCRIPTION

Figure 1:
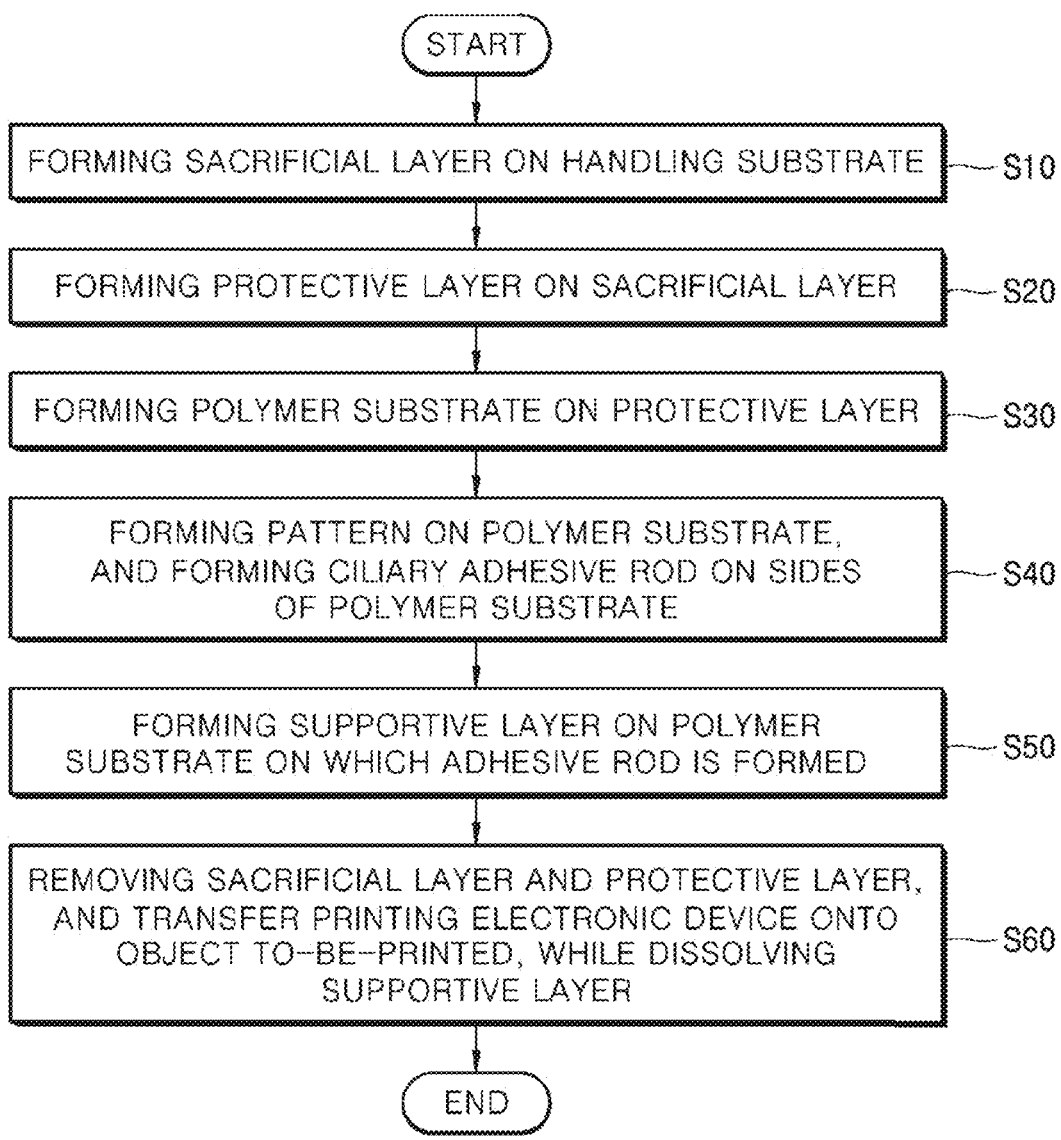
FIG. 1 shows a process flow chart that illustrates a transfer printing of electronic devices according to an embodiment of the preset disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The terminology used herein is for the purpose of describing particular exemplary embodiments only and is not intended to be limiting. As used herein, the singular forms "a," "an," and "the" may be intended to include plural referents as well, unless the context clearly indicates otherwise. The terms "comprises," "comprising," "including." and "having," are inclusive and therefore specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by those skilled in the art to which the present disclosure relates. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method for transfer printing of an electronic device according to a preferred embodiment of the present disclosure will be described with reference to the accompanying drawings.

Conventionally, a transfer printing process was introduced to bond electronic devices to irregular surfaces that are difficult to apply a direct process, and adhesives were used to increase flexibility or increase adhesion by using a thin polymer substrate. However, in the case of complicated surfaces such as a textile, since a sufficient contact area cannot be obtained with a thin polymer substrate alone, it is difficult to secure an adhesion, and using too much glue may lose the inherent characteristics of a substrate. Thus, we have completed the present invention by introducing a ciliary adhesive rod for enhancing the adhesion while minimizing an interfacial mismatch, when transferring electronic devices onto surfaces of a complicated structure.

FIG. 1 shows a process flow chart that illustrates a transfer printing process of electronic devices according to an embodiment of the preset disclosure. Referring to FIG. 1, a method for transfer printing of an electronic device according to an embodiment of the present disclosure may include forming a sacrificial layer on a handling substrate (S10); forming a protective layer on the sacrificial layer (S20); forming a polymer substrate on the protective layer (S30); forming a pattern on the polymer substrate, and forming a ciliary adhesive rod on the sides of the polymer substrate (S40); forming a supportive layer on the polymer substrate on which the adhesive rod is formed (S50); and removing the sacrificial layer and the protective layer, and turning over and transfer printing the electronic device onto an object to-be-printed, while dissolving the supportive layer (S60).

Figure 2:
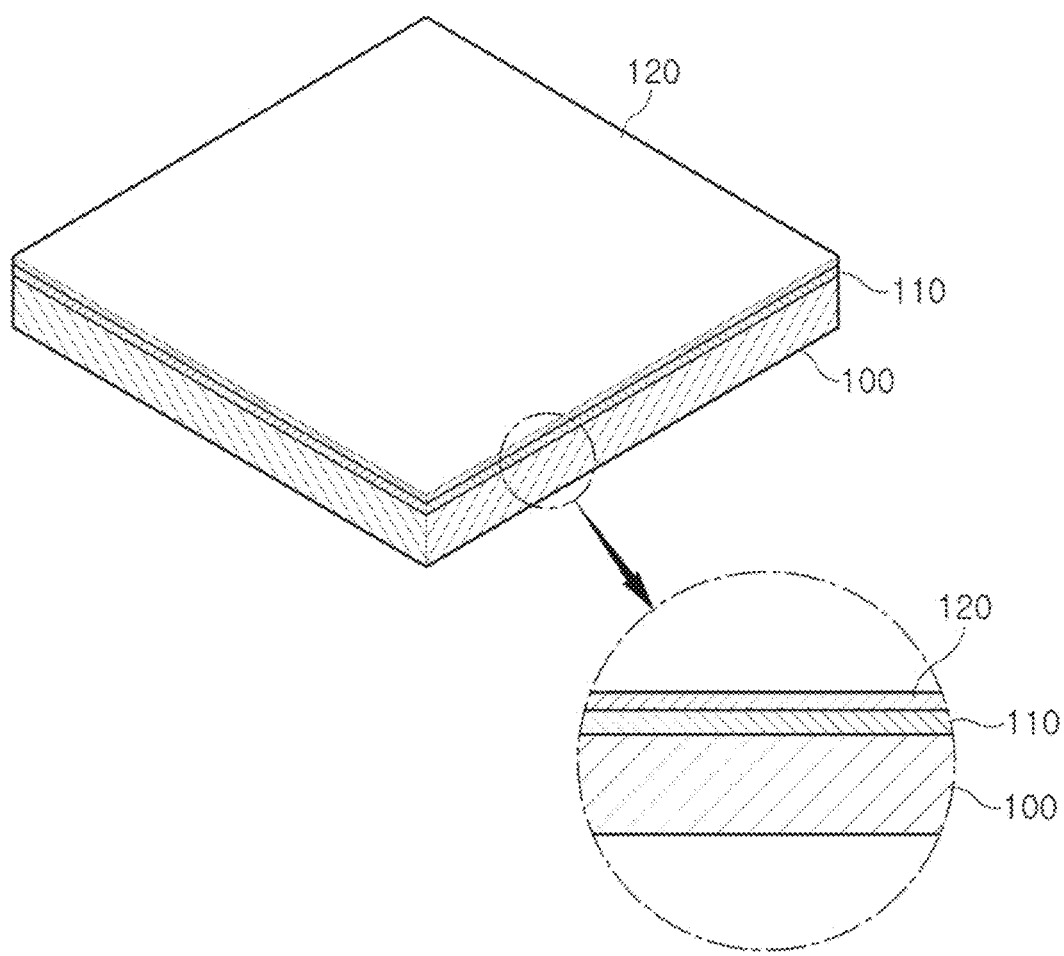
FIGS. 2 to 4 show perspective and partial cross-sectional views that sequentially illustrate a process for transfer printing of electronic devices according to an embodiment of the present disclosure.

FIGS. 2 to 7 show perspective and partial cross-sectional views that sequentially illustrate a process for transfer printing of electronic devices according to an embodiment of the present disclosure. According to some embodiments of the present disclosure, as shown in FIG. 2, a handling substrate 100 is prepared for ease of processing in the transferring process, a sacrificial layer 110 is formed on the handling substrate 100 (S10), and a protective layer 120 is formed on the sacrificial layer 110 to protect the sacrificial layer 110 from being etched during the process (S20).

The handling substrate 100 should be as thin as possible for easy handling during the transferring process, and may include a glass or a silicon substrate. The sacrificial layer 110 may be a water-soluble thin film such as germanium oxide (GeOx). The protective layer 120 may be a silicon thin film as a thin film which is not etched by an etchant so as to protect the underlying sacrificial layer 110. A variety of methods may be employed to form such a thin film based on its type. For example, when the sacrificial layer 110 is formed on the handling substrate 100 by sputtering with a water-soluble GeOx, the protective layer 120 may be formed with a water-insoluble silicon oxide film, metal, or polymer thin film by sputtering, plasma enhanced chemical vapor deposition (PECVD), E-beam evaporator, thermal evaporator, spin coating, bar coating, spray coating, or the like.

Figure 3:
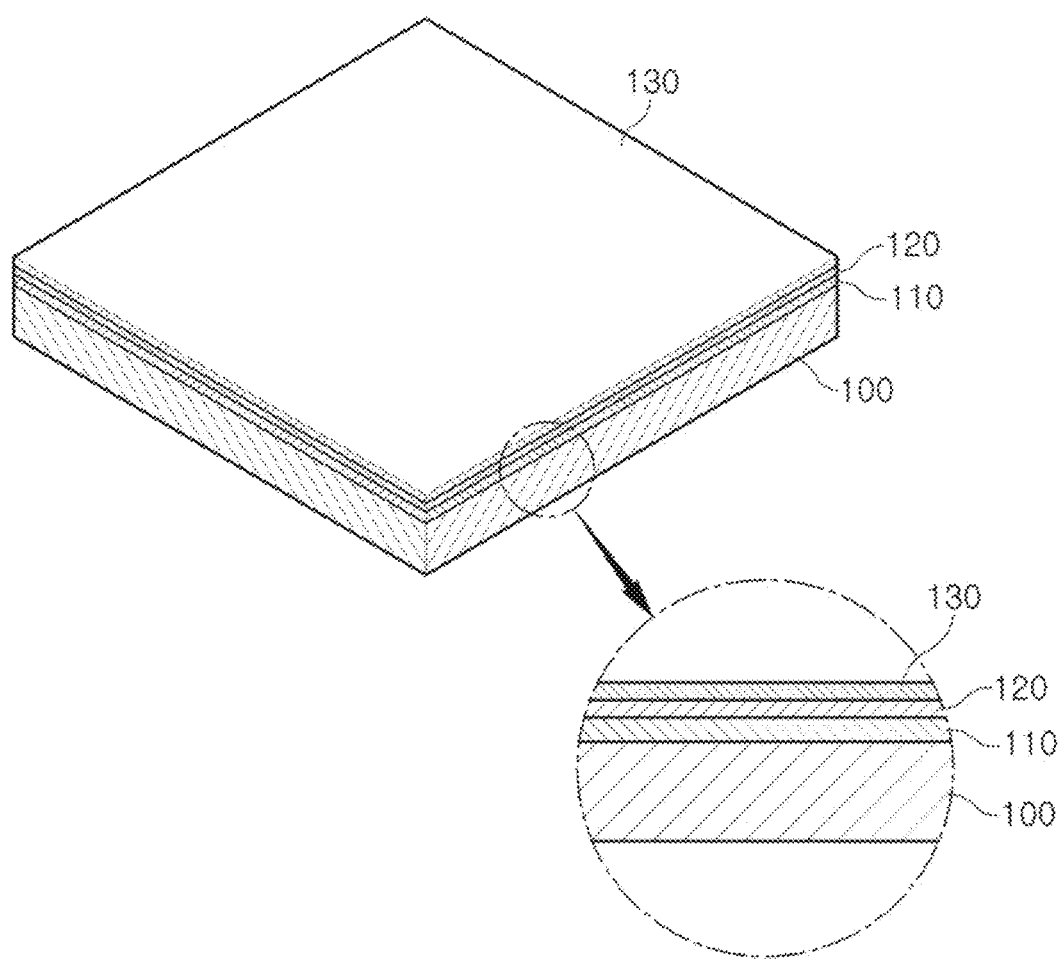

As shown in FIG. 3, the polymer substrate 130 is formed on the protective layer 120 (S30). The polymer substrate 130 is a substrate for forming an electronic device, and a polymer material is used to provide flexibility thereto. A variety of materials may be used for the polymer substrate 130, particularly based on the temperature used. An organic thin film such as polyimide for a temperature greater than 200° C., and polyethylene terephthalate (PET), polyether- sulfone (PES), polystyrene (PS), polycarbonate (PC), polyethylene naphthalate (PEN), polyarylate (PAR), or SU-8 polymer for a temperature not greater than 200° C. may be used.

Figure 4:
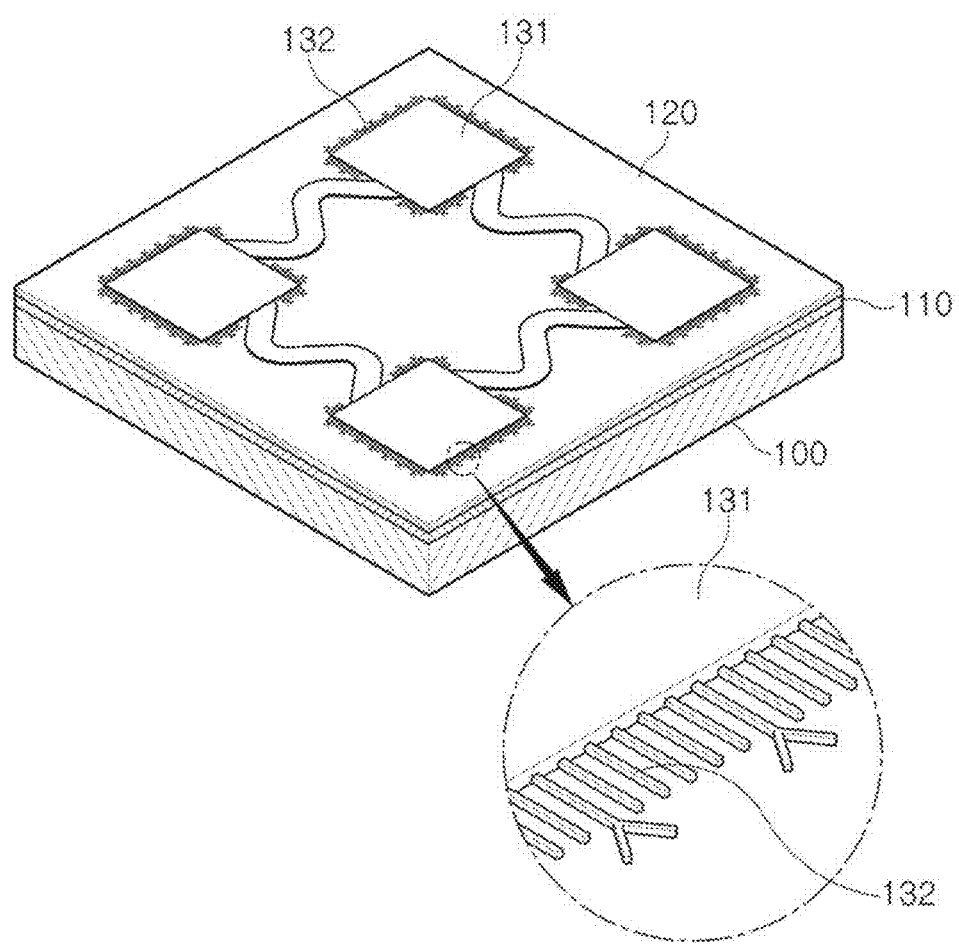

As shown in FIG. 4, the polymer substrate 130 formed on the protective layer 120 is patterned using an etching process to form a patterned substrate 131 on which devices are formed, and ciliary adhesive rods 132 (S40). A method of patterning the polymer substrate 130 may be a dry etching process. For example, a polyimide polymer substrate can be dry-etched by generating oxygen plasma using a reactive ion etching, or a polyimide polymer substrate can be wet-etched using potassium hydroxide (KOH).

A silicon oxide film, a metal thin film, GeOx, $Si_3N_4$, or the like which can protect the polyimide substrate without being etched by oxygen plasma may he used as a mask thin film layer which can protect the polymer substrate from plasma when dry etching is used. In the case of using wet etching, a silicon oxide film which can protect the polyimide substrate without being etched by an alkaline solution as a mask thin film layer may be used.

The ciliary adhesive rods 132 to be formed may be rectangular-shaped or Y-shaped having a high aspect ratio. In the case of a rectangular-shaped rod having a high aspect ratio, lateral ciliary adhesive rods having various shapes in the periphery of the substrate can be made to form a hierarchical structure. In addition, the length, thickness, and width of the adhesive rods may be varied in various ways depending on a device to be manufactured or an object to be transferred.

Figure 5:
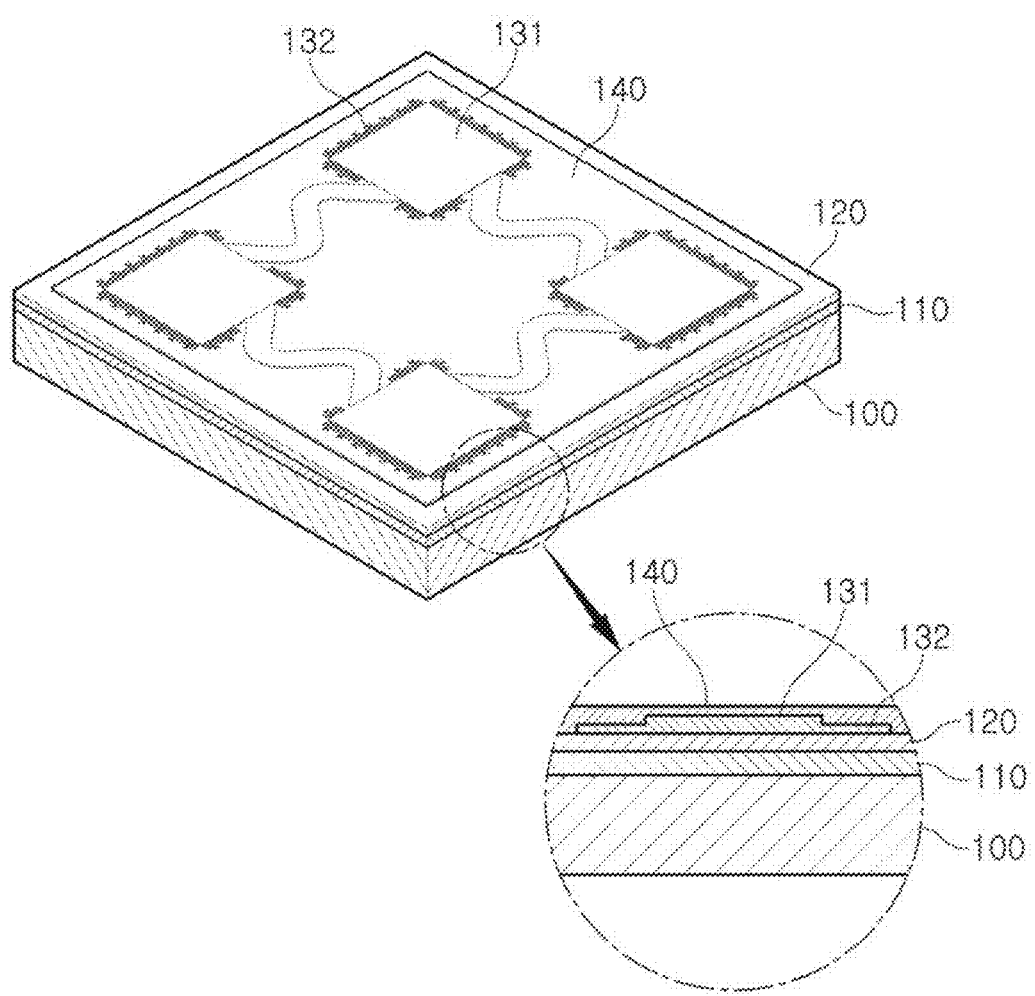
FIGS. 5 to 7 show perspective and partial cross-sectional views that illustrate a process for transfer printing of a polymer substrate from a handling substrate onto a textile according to an embodiment of the present disclosure.

As shown in FIG. 5, a supportive layer 140 is formed to support the patterned substrate 131 and the ciliary adhesive rods 132 so that the shapes of the patterned substrate 131 and the ciliary adhesive rods 132 are not deformed in the process of transfer printing an electronic device to a desired object (S50). The supportive layer 140 may be formed of an organic thin film layer, and may include a polymethyl methacrylate (PMMA). It is possible to prevent the ciliary adhesive rods 132 from being damaged before transfer printing by the supportive layer 140.

Figure 6:
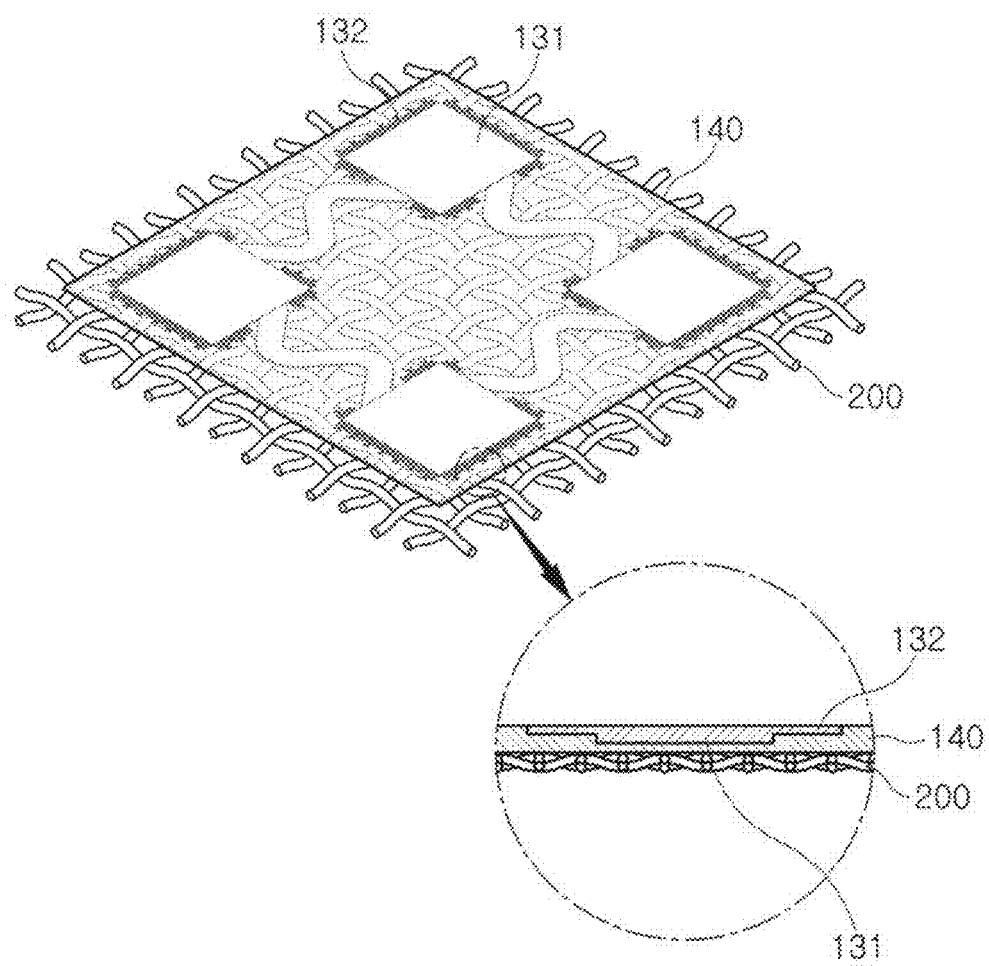
Figure 7:
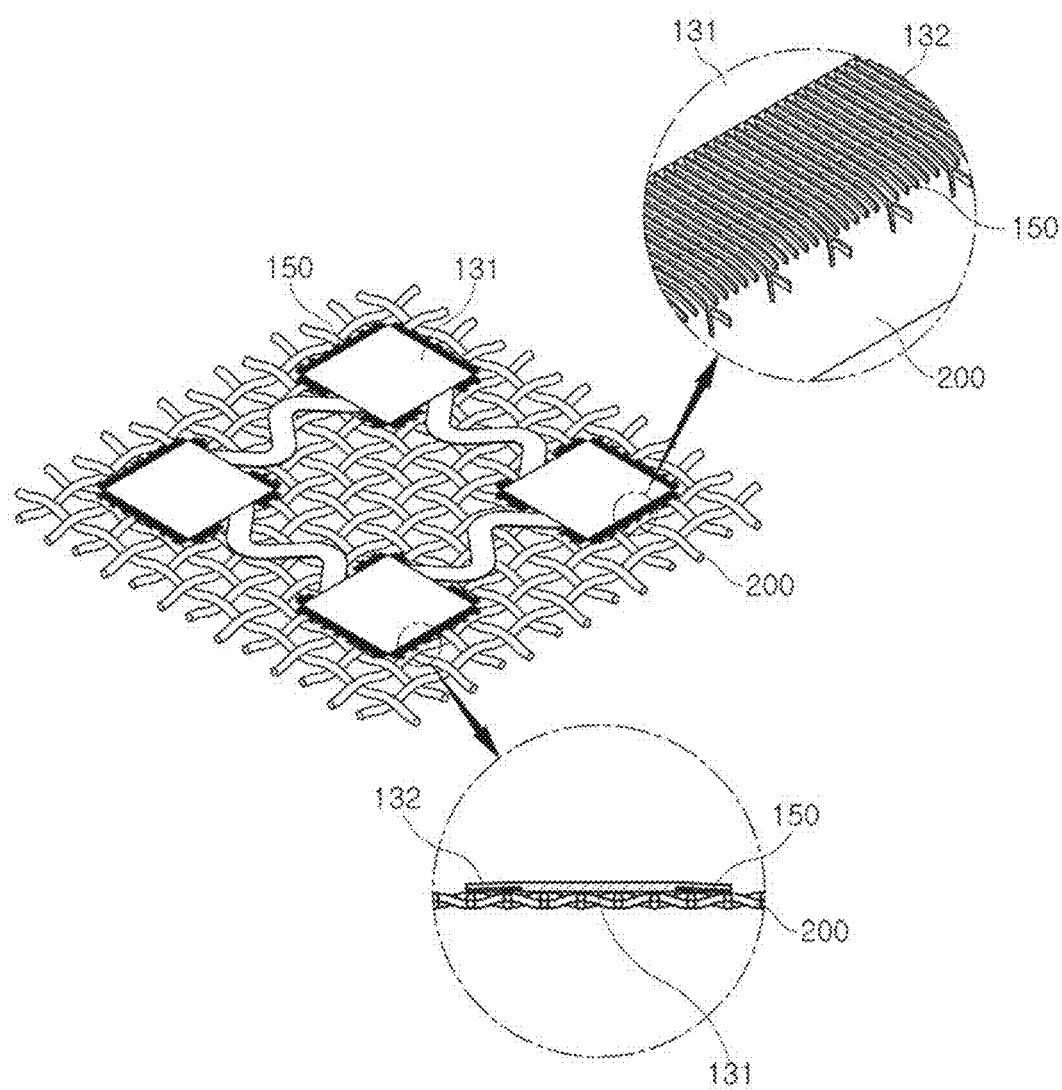

As shown in FIGS. 6 to 7, the sacrificial layer and the protective layer are removed for transfer printing of electronic devices, while inverting and dissolving the supportive layer and transfer printing of the electronic devices onto an object to be printed (S60). If the sacrificial layer and the protective layer are etched in an etching solution to transfer the devices to the surfaces of a textile 200, the adhesion with the handling substrate 100 becomes weak, and the substrate 131 patterned from the handling substrate and the ciliary adhesive rods 132 may easily be delaminated. In addition, the devices floating in the etching solution through buoyancy are directly transferred into a deionized water to remove the etching solution, and the devices are turned over to be transfer-printed onto the textile 200. The organic solvent capable of dissolving the supportive layer 140 may be dropped to enhance the adhesion with the supportive layer, thereby completely transferring the electronic devices onto the textile 200. In order to form an adhesive while simultaneously removing the supportive layer 140, an adhesive solution is prepared by dissolving a polymer to be used as an adhesive into an etching solution capable of dissolving the supportive layer 140. The supportive layer 140 may be completely dissolved while the adhesive solution is dropped onto the devices transfer-printed onto the textile 200, and during the process of drying the adhesive solution, the ciliary adhesive rods 150 may wrap onto the threads of the textile by a capillary force, and thereby the adhesive can guarantee a strong adhesion around the ciliary adhesive rods 132.

The adhesive may include a polydimethylsiloxane (PDMS) or polymethyl methacrylate (PMMA). The organic solvent may include a toluene, an acetone, or a hexane.

Textiles are described as an object to which the electronic devices are transfer printed, but not limited thereto. For example, electronic devices may be transfer printed onto an object having complex surfaces such as textiles having various materials and shapes, tea strainer that filters tea leaves, bandages, and stones.

Hereinafter, exemplary experimental examples will be described in more detail in order to facilitate understanding of the present disclosure.

EXPERIMENTAL EXAMPLE 1

Manufacturing and Transferring of Transfer Printing Substrate

1. Formation of Sacrificial and Protective Layers on a Handling Substrate

Silicon (Si) substrate was sequentially washed with acetone, isopropyl alcohol (IPA) and deionized water, and dried at about 110° C. for about 1 minute. A sacrificial GeO (thickness=300 nm) layer which is etchable in water was deposited on the dried Si substrate using a sputter (Ar/$O_2$=10/5 sccm, 2.5 mTorr, 55~60 W, Korea Vacuum Tech., Ltd). Then, a protective $SiO_2$ (thickness=100 nm) layer was deposited on the sacrificial layer using a plasma-enhanced chemical vapor deposition (gas flow: Ar=90 sccm, $SiH_4$=10 sccm, $N_2O$=100 sccm, 270° C., SNTEK).

2. Formation of a Polymer Substrate and Patterning of the Substrate and Ciliary Structure A polyimide precursor (poly(3,3',4,4"-benzophenonetetracarboxylic dianhydride-co-4,4'-oxydianiline/1,3-phenylenediamine), atretic acid solution, Sigma-Aldrich) was applied on the handling substrate by spin coating (3,000 rpm, 60 sec), followed by sequentially curing at 120° C. for 3 minutes, 180° C. for 10 minutes, and then 250° C. for 2 hours, to form a polyimide thin film (thickness=about 2 μm). The above procedure was repeated once more to adjust the thicknesses of the substrate and the ciliary adhesive rods to form a polyimide thin film having a total thickness of 4 μm.

For the patterning of the polyimide thin film, a chromium thin film having a thickness of 50 nm was deposited by sputtering (Ar=15 sccm, 5 mTorr, 270 V Korea Vacuum Tech., Ltd) or a $SiO_2$ thin film having a thickness of 100 nm was created using a PECVD (gas flow: Ar=90 sccm, $SiH_4$=10 sccm, $N_2O$=100 sccm, SNTEK). For the patterning of the Cr or $SiO_2$ thin film, HMDS (AZ AD Promoter-K, 4000 rpm, 35 sec) and photoresist (PR) (AZ 1512, 4000 rpm, 35 sec) were sequentially coated, and the photoresist was exposed to 365 nm UV using a chromium mask (Supermask Co. Ltd.) having a desired substrate shape, and then developed with an aqueous basic developer (AZ 500 MIF, AZ Electronics Materials) to form a desired patterned photoresist. The Cr and $SiO_2$ thin films were etched using Cr etchant (CYANTEK, CR-7) and BOE (buffered oxide etchant, JT-BAKER) to form a mask for the patterning of the polyimide substrate. The polyimide thin film was etched using a reactive ion etching (RIE; Vacuum Science, 50 mTorr, 20 sccm, O2, 150 W, 7 minutes). At this time, the polyimide thin film was etched only about half, and the thickness of the remaining portion except for the substrate portion where the devices are to be formed was thinned. Cr and $SiO_2$ thin film masks were removed using a Cr etchant and BOE.

For the patterning of the ciliary adhesive rods, a chromium thin film having a thickness of 50 nm was deposited by sputtering (Ar=15 sccm, 5 mTorr, 270 V, Korea Vacuum Tech., Ltd) or a $SiO_2$ thin film having a thickness of 100 nm was created using a PECVD (gas flow: Ar=90 sccm, $SiH_4$=10 sccm, $N_2O$=100 sccm, SNTEK). For the patterning of the Cr or $SiO_2$ thin film, HMDS (AZ AD Promoter-K, 4000 rpm, 35 sec) and photoresist (PR) (AZ 1512, 4000 rpm, 35 sec) were sequentially coated, and the photoresist was exposed to 365 nm UV using a chromium mask (Supermask Co. Ltd.) having a ciliary adhesive rods, and then developed with an aqueous basic developer (AZ 500 MIF, AZ Electronics Materials) to form a desired patterned photoresist. The Cr and $SiO_2$ thin films were etched using Cr etchant (CYANTEK, CR-7) and BOE (buffered oxide etchant, IT-BAKER), respectively. The thinned polyimide thin film through the previous procedure was etched using a reactive ion etching (RIE; Vacuum Science, 50 mTorr, 20 sccm, O2, 150 W, 7 minutes).

3. Formation of a Supportive Layer and Removal of the Sacrificial and Protective Layers PMMA (polymethyl methacrylate, MicroChem, A11) was coated on the substrate by spin coating (3000 rpm, 60 sec) as a supportive layer to maintain the shapes of the substrate and the ciliary adhesive rods patterned in the transfer printing process.

The substrate was placed in deionized water at 70° C. for about 4 hours to remove the GeOx sacrificial layer. The $SiO_2$ protective layer was floated in and etched with a BOE solution in Which the polymer substrate had been diluted that was supported by the supportive layer floated on the water by buoyancy. The substrate was transferred into water and washed again with water to remove the BOE solution.

4. Transfer Printing

The substrate floated in deionized water was turned over and transferred onto a textile, and then PMMA as a supportive layer was slightly dissolved into toluene to increase the adhesion between the textile and the substrate. An adhesive solution was prepared by dissolving 1 to 5 wt. % PDMS (polydimethylsiloxane, Sylgard 184, Dow Coming) or PMMA into toluene to prepare an adhesive while completely dissolving the supportive layer. The substrate was annealed at 120° C. for 2 hours to evaporate the adhesive solution, and then the adhesive was cured and crosslinked.

Figure 8:
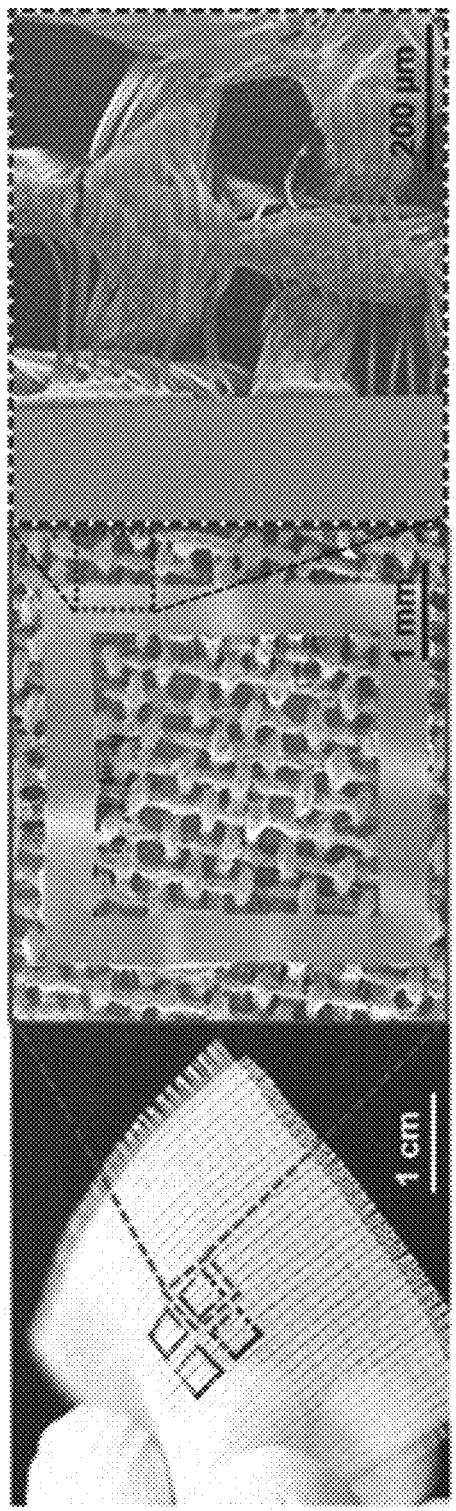
FIG. 8 shows photographs and scanning electron microscope (SEM) images of a polymer substrate printed onto a textile through a transfer printing process.

FIG. 8 shows SEM images of a substrate transferred onto a textile surface by a transferring process of an electronic device according to an embodiment of the present disclosure. As shown in FIG. 8, we have confirmed that the patterned substrate was adhered onto the textile by the transfer printing process. Referring to the enlarged images, the ciliary adhesive rods wrapped the thread strands in the textile, so that they can be bonded by mechanical and Van der Waals forces. It can also be seen that the ciliary adhesive rods can be bonded more strongly to the thread strands through a chemical bond with a help of the adhesive collected at the end of the ciliary adhesive rods in the drying process of the adhesive solution.

EXPERIMENTAL EXAMPLE 2

Air Blowing Test for Adhesion Measurement

Polymer substrates with and without having the ciliary adhesive rods were transfer printed onto a textile, and the adhesions were compared through air blowing. Further, the effects of the length and density of the cilia structure and the concentrations of the adhesive solution on the adhesions were observed.

Figure 9A:
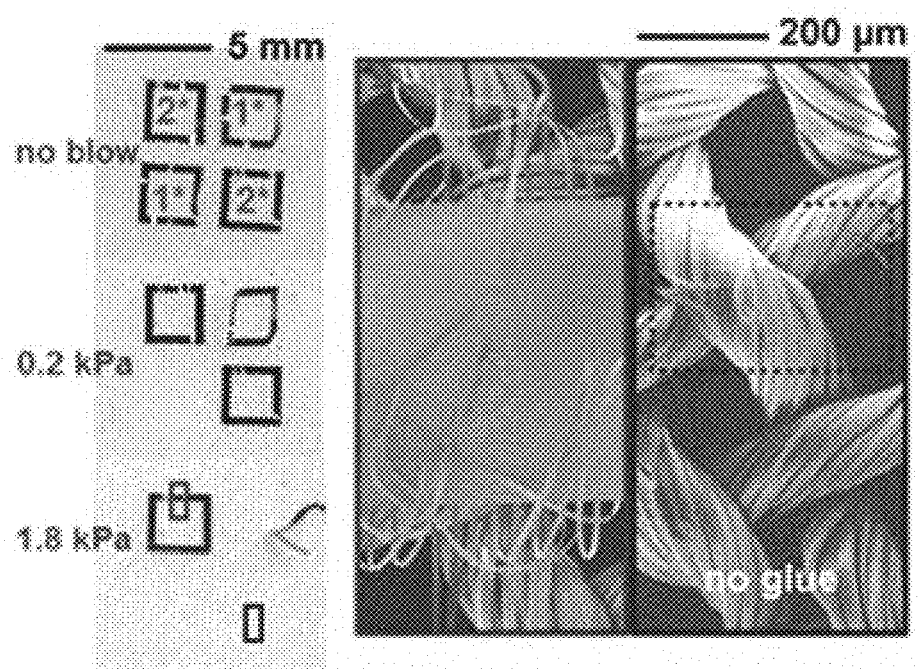
FIGS. 9A to 9B show photographs and SEM images taken under air blowing experiments for measuring adhesion with/without ciliary adhesive rods of a polymer substrate printed onto a textile, and with/without the use of an adhesive solution.

FIG. 9A shows samples obtained by transferring a polymer substrate onto a textile, and then dissolving a supportive layer only in a toluene without using an adhesive solution, wherein 1* indicates a polymer substrate without ciliary adhesive rods, and 2* indicates a polymer substrate with ciliary adhesive rods. We confirmed that when nitrogen gas was injected through air gun to apply a blowing air of 0.2 kPa, the substrate without the ciliary adhesive rods could not withstand the blowing air pressure and as a result detached, whereas the substrate with the ciliary adhesive rods maintained its position while bonded thereto. When a blown air of 1.8 kPa or more was applied, the substrate with the ciliary adhesive rods lost its adhesion. Therefore, as shown in the SEM images, while the ciliary adhesive rods were in wrap-around the textile for a little while, they were shortly delaminated or a little amount of ciliary structures were broken apart by the blowing air.

Figure 9B:
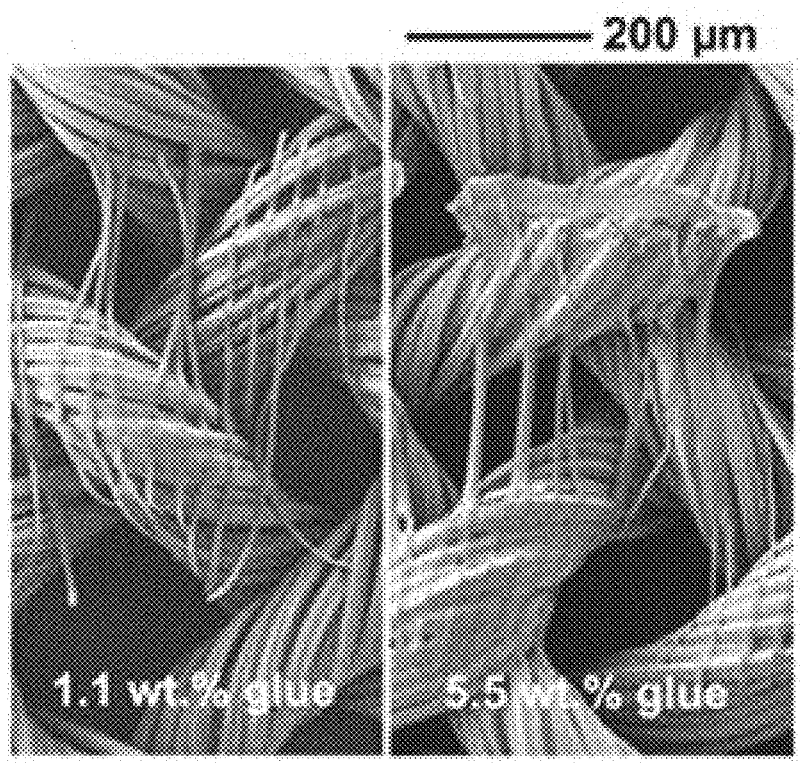

In FIG. 9B, we have confirmed that the ciliary adhesive rods and the textiles are adhered with much greater force when the adhesive remains on the ciliary adhesive rods, and the SEM images also indicated that the substrate may be torn off by a blowing air pressure.

Figure 10A:
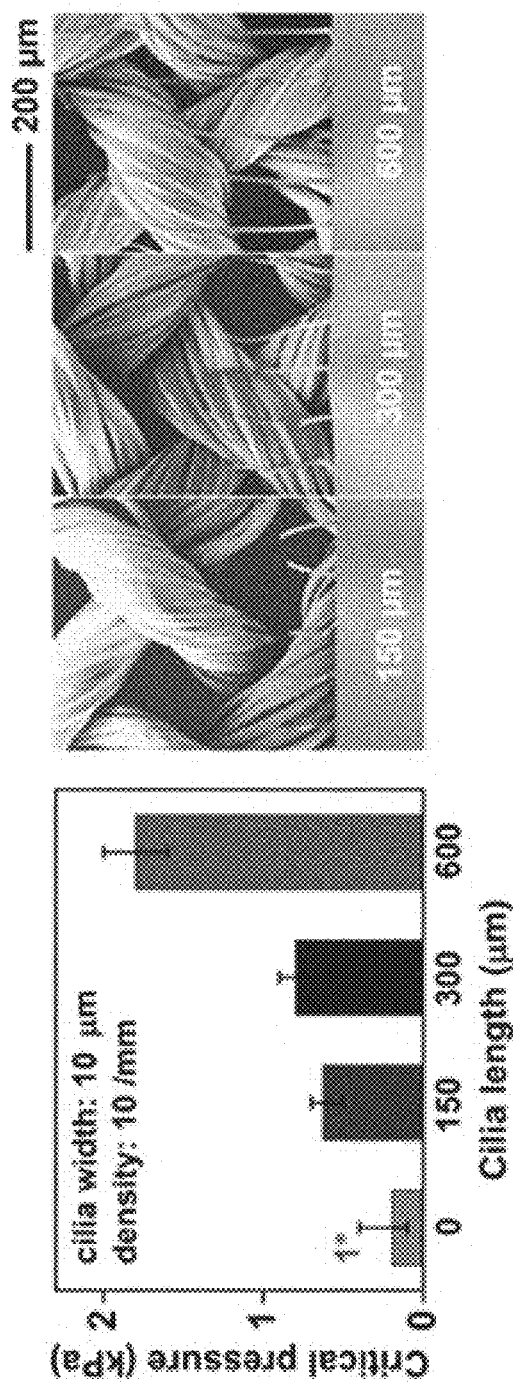
FIGS. 10A to 10C show graphs and SEM images taken under air blowing experiments for measuring adhesion with various cilia length scales, cilia densities, and concentrations of an adhesive solution.

FIG. 10A shows the results of blowing air pressure test for comparing adhesive strength by controlling the length of the ciliary adhesive rods to 0, 150, 300, and 600 μm, respectively, and transferring the polymer substrate without using an adhesive. In this case, critical pressure refers to a blowing air pressure at which the polymer substrate transfer printed on the textile loses its adhesiveness. The test was conducted under the same conditions, i.e., the width of the ciliary adhesive rods was 10 μm, and the density of the ciliary adhesive rods was 10 per 1 mm. As shown in FIG. 10A, the critical pressure greatly increases as the aspect ratio of the ciliary adhesive rods increases. In the case of a short ciliary adhesive rod, it is not sufficiently bonded to the threads in the textile, but when the length is long enough, the threads can he wrapped to obtain a larger adhesive strength.

Figure 10B:
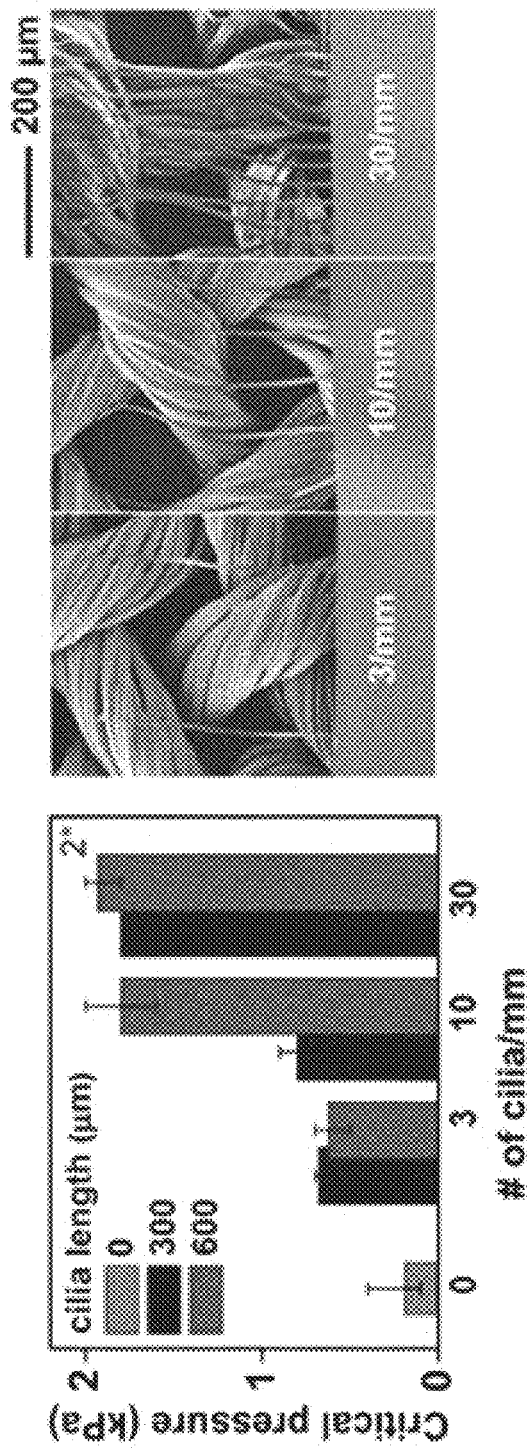
Figure 10:
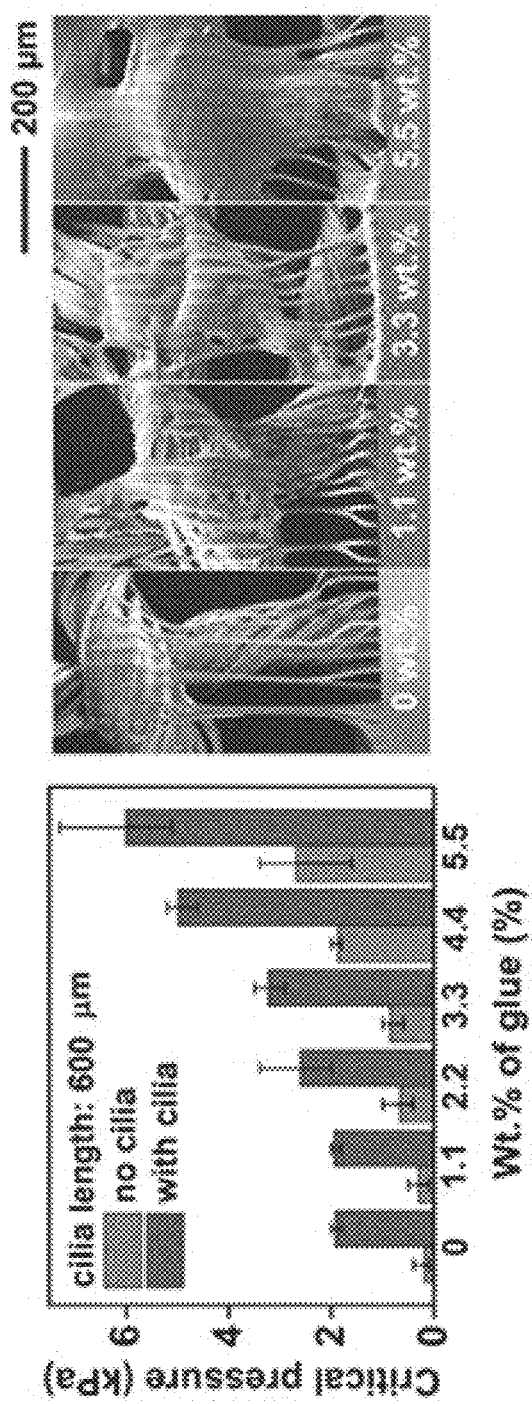

In FIG. 10B, the critical pressure was measured for a substrate in which the density of the ciliary adhesive rods was increased to 0, 3, 10, and 30 per 1 mm, without using an adhesive. The results were reported while changing the density when the length of the ciliary adhesive rods was 0, 300, and 600 μm, respectively.

At this time, the width of the ciliary adhesive rods was fixed at 10 μm. As shown in FIG. 10B, the critical blowing air pressure greatly increases as the density increases. The critical blowing air pressure was 0.19 kPa in the absence of the ciliary adhesive rod. When the density increased to 3, 10, and 30 per 1 mm at the length of the ciliary adhesive rod of 300 μm, the critical blowing air pressure values increased to 0.68 kPa, 0.8 kPa, and 1.8 KPa, respectively. When the density increased to 3, 10, and 30 per 1 mm at the length of the ciliary adhesive rod of 600 μm, the critical blowing air pressure values increased to 0.63 kPa, 1,83 kPa, and 1.93 kPa, respectively. As can be seen from the SEM images in FIG. 10B, as the density increases, more ciliary adhesive rods can be bonded to the threads in the textile, thereby showing a greater adhesive strength.

The critical blowing air pressures were measured at the time of using the adhesive while adjusting the concentration of the adhesive solution in the transfer printing process, and shown in FIG. 10C. The lengths of the ciliary adhesive rods were fixed to 600 μm, the width was 10 μm, and the density was 30 per 1 mm, while the concentration of the adhesive solution was adjusted to 1.1, 2.2, 3.3, 4.4, and 5.5 wt. %, respectively. In this case, the adhesive solution was prepared by dissolving PDMS in toluene at various concentrations. In addition, the bar graph on the left indicates a substrate transfer printed with no ciliary adhesive rods, and the right one indicates a substrate transfer printed with the ciliary adhesive rods. As can be seen from the graph of FIG. 10C, the critical blowing air pressure greatly increases as the concentration of the adhesive solution increases. In the case of the absence of the ciliary adhesive rods, when the concentrations increased to 0, 1.1, 2.2, 3.3, 4.4, and 5.5 wt. %, the critical blowing air pressure values increased to 0.19, 0.31, 0.68, 0,87, 1.88, and 2.7 kPa, respectively, while in the case of the presence of the ciliary adhesive rods, when the critical blowing air pressure values increased to 1.93, 1,95, 2.61, 3.23, 5, and 6.02 kPa, respectively. As can be seen from the scanning microscope image of FIG. 10C, as the concentration of the adhesive solution increases, the adhesive solution is dried and the adhesives are largely gathered near the ciliary adhesive rods, providing greater adhesion. Therefore, by controlling the length and density of the ciliary adhesive rods and the concentration of the adhesive solution, it is possible to secure a large adhesive strength between the ciliary adhesive rods and the textiles in the transfer printing process. Although these are the results for one kind of textile, the critical bowing air pressure can be changed according to the degree of the fineness, material and weaving of the textile.

EXPERIMENTAL EXAMPLE 3

Transfer Printing Onto a Substrate Having Various Shapes and Sizes, and Transfer Printing to an Object To-Be-Printed Having Various Surface Structures Polymer substrates were fabricated in various shapes and sizes by patterning, and then transfer printed onto textiles. In addition to the textiles, transfer printing was also performed onto a tea strainer, cotton swabs, and stones, which have various structures. Accordingly, this process was proved to have the utilities for many applications.

Figure 11A:
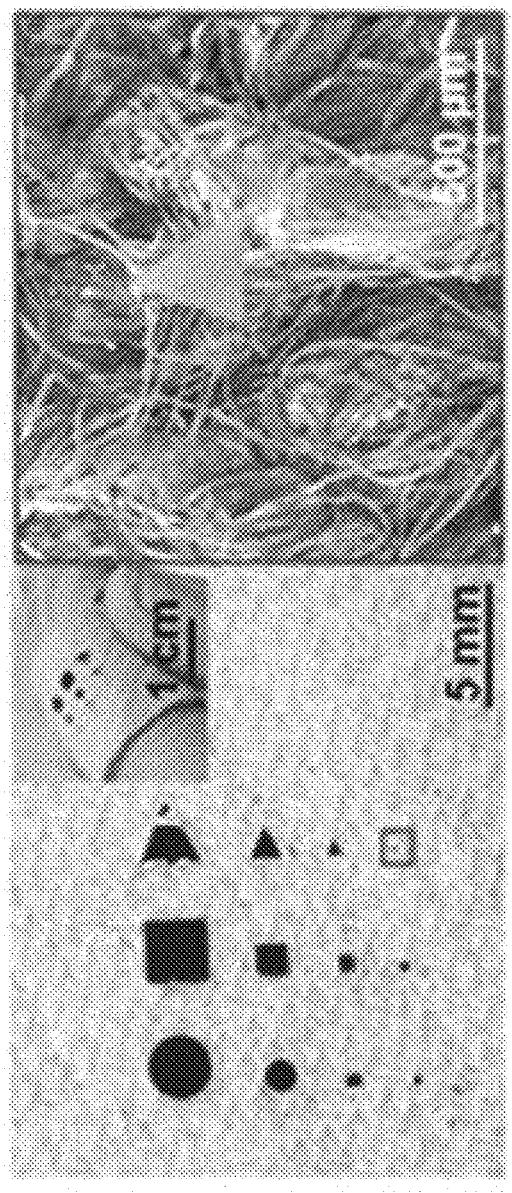
FIGS. 11A to 11E show photographs and SEM images obtained by transfer printing a polymer substrate having various shapes and sizes onto a substrate to-be-printed having various surface structures including a textile according to Experimental Example 1.

FIG. 11A shows photographs illustrating states in which polymer substrates patterned in circle, square, and triangular shapes and having the ciliary adhesive rods were prepared by the above method and then transfer printed onto a bandage. Through the SENT image of the smallest among these substrates, it can be seen that the ciliary adhesive rods can adhere substrates having various shapes and sizes to the textiles with strong adhesive strength.

Figure 11B:
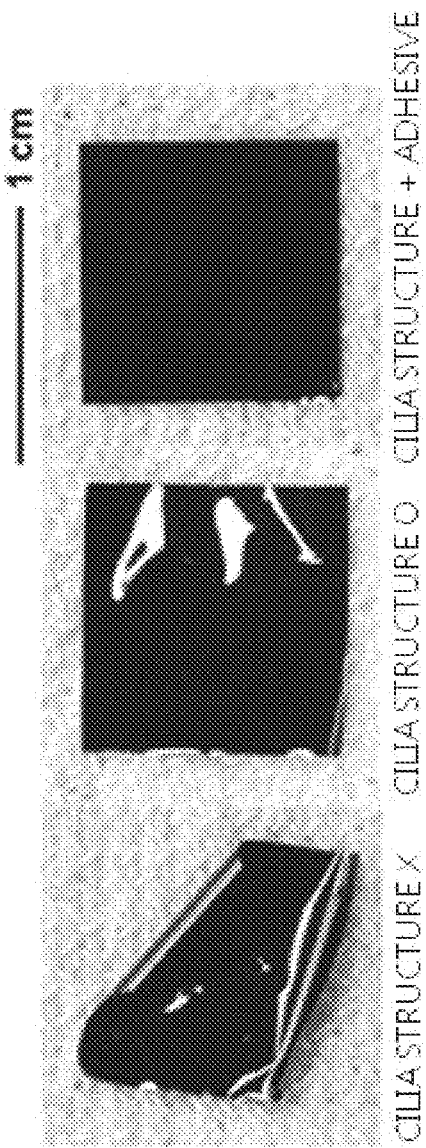

FIG. 11B shows that a large-area substrate having a size of 1 cm can be transfer printed onto a bandage through a ciliary adhesive rod or a ciliary adhesive rod and an adhesive. In the absence of a ciliary adhesive rod, the adhesive strength was weak and the edges were curled or the center was delaminated.

Figure 11C:
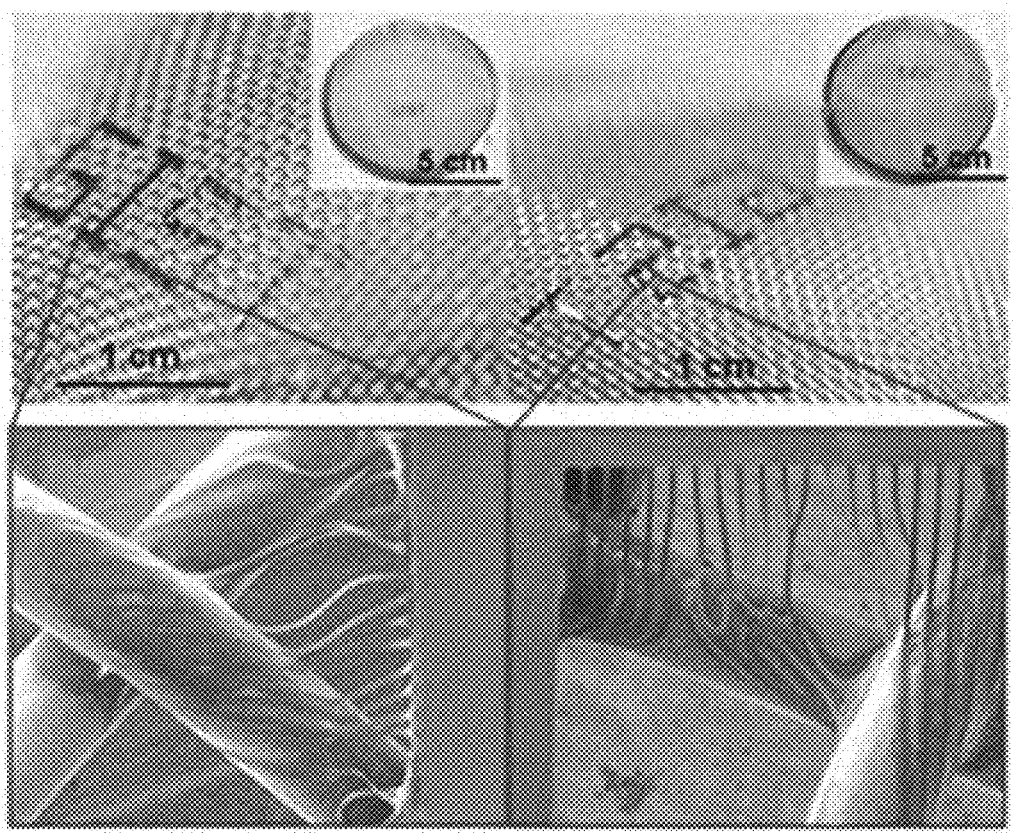
Figure 11D:
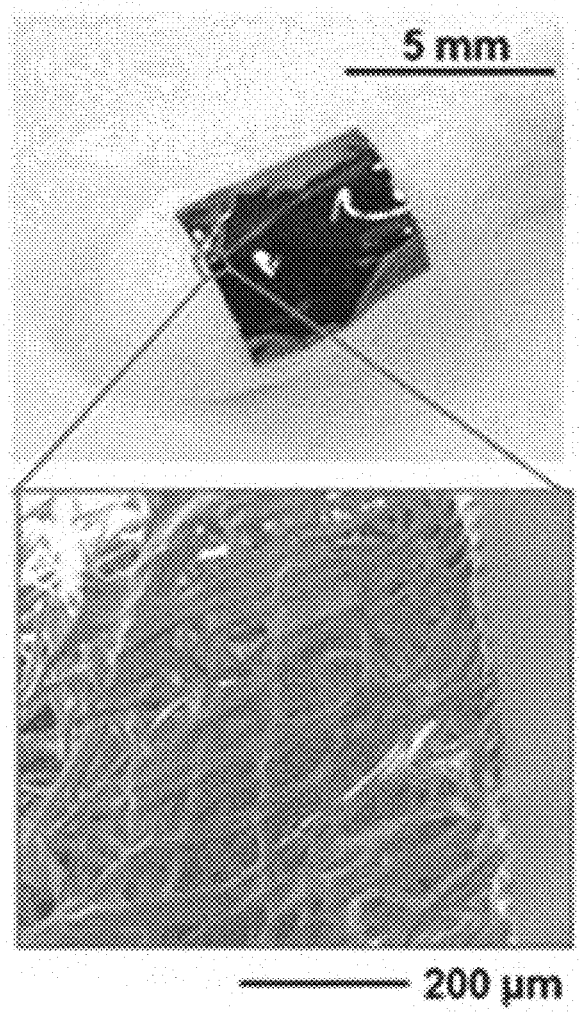
Figure 11E:
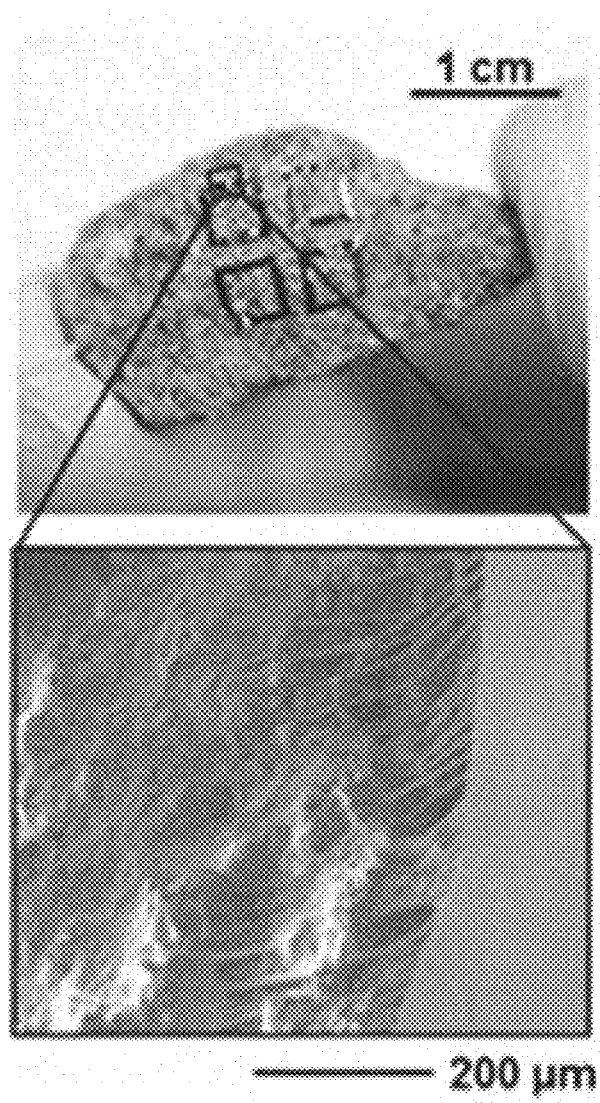

FIGS. 11C to 11E show photographs and SEM images where polymer substrates were transfer printed onto a surface having various structures. FIG. 11C shows a sieve filter which filters tea leaves, having a complex structure in which thread-shaped irons are interwoven. However, as shown in the SEM image, it can be seen that they were transfer printed through the ciliary adhesive rods and the adhesive with great adhesiveness. Also, it can be seen that even when the polymer substrate coated with the supportive layer was transferred as it is or inverted in transfer printing, the same ciliary adhesive rods well wrapped a thin wire. We could confirm that, as shown in FIGS. 11D and 11E, the ciliary adhesive rods were well adhered to irregular surfaces such as cotton swabs which were entangled with thread strands and coarse rough stones along the surfaces thereof, allowing a moderate transfer printing while securing a larger adhesive strength through the adhesive.

EXPERIMENTAL EXAMPLE 4

Tensile Test for a Transfer Printing Substrate Having Electrodes Transfer Printed Onto a Textile In the process according to Experimental Example 1, chromium having a thickness of 5 nm and gold having a thickness of 70 nm were deposited on a polymer substrate by sputtering to form an electrode. The width of the electrode was 40 µm. By making its structure as a wave pattern, the stress applied to the electrode in the tensile test was reduced. The electrode was also encapsulated by a polyimide to minimize a mechanical stress on the mechanical neutral plane.

Figure 12:
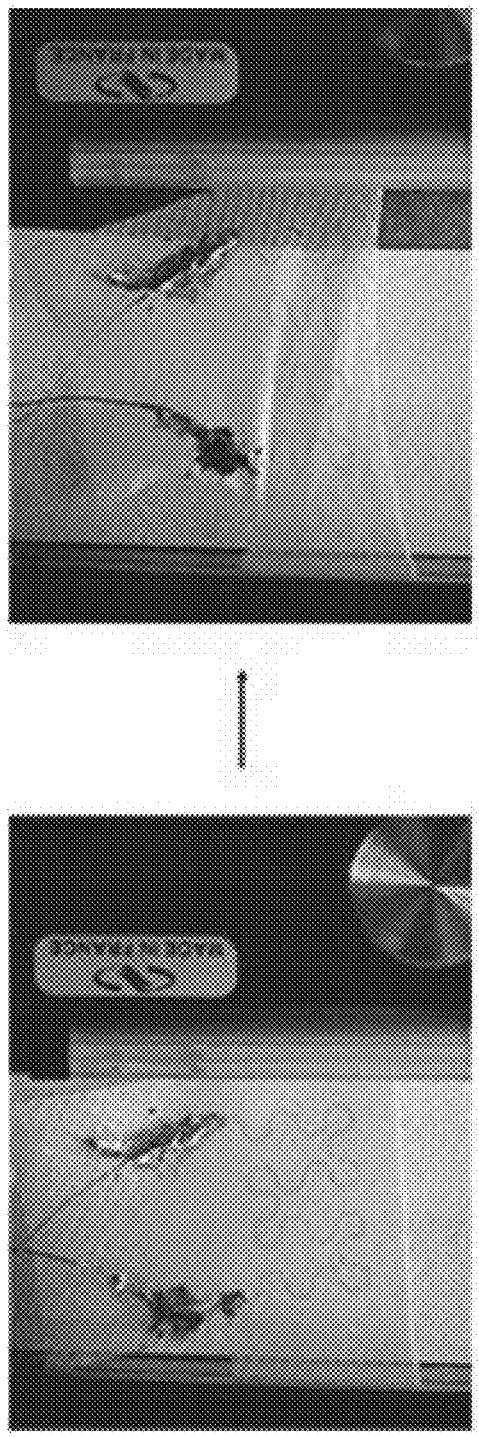
FIG. 12 shows a tensile deformation experiment of a polymer substrate including an electrode transfer-printed onto a textile according to Experimental Example 1.

FIG. 12 shows photographs illustrating a transfer printing substrate including an electrode transfer printed onto a textile, which is clamped to both jigs and subjected to tensile deformation on both sides. At this time, the electrode was connected to the outside to measure the current change in a specific tensile strain range.

Referring to FIGS. 13A to 13D, four kinds of tensile tests were performed in this experiment. Form A of FIG. 13A indicates that the direction in which the thread is twisted is in parallel with the electrode, Form B of FIG. 13B indicates that the direction in which the thread is twisted is in diagonal with the electrode, Form C of FIG. 13C indicates that the direction in which the thread is twisted is in diagonal with the electrode, and the textile and the electrodes are covered with PDMS and cured, and Form D of FIG. 13D indicates that the electrode is covered only with PDMS without a textile and cured. For each case, photographs for the samples with a force of about 4N are shown, in which each of the samples shows a different tensile strain value due to the nature of the samples. In the case of textile, when stretching in the direction in which threads are woven, only small tensile strain is produced even in large stress, and in the case of diagonal direction, it shows large deformation even in small stress as shrinkage deformation occurs in the up and down direction of the textile. In addition, it can be seen that since when the electrode is covered with PDMS, even though the PDMS is an elastomer, the PDMS is cured between the threads, and the threads cannot move freely, the strain is small even at a large stress. When PDMS alone is used to cover the top and bottom of the electrode, it is seen that large elastic deformation was occurred even at small stresses, while showing the characteristics of an elastomer.

Figure 13A:
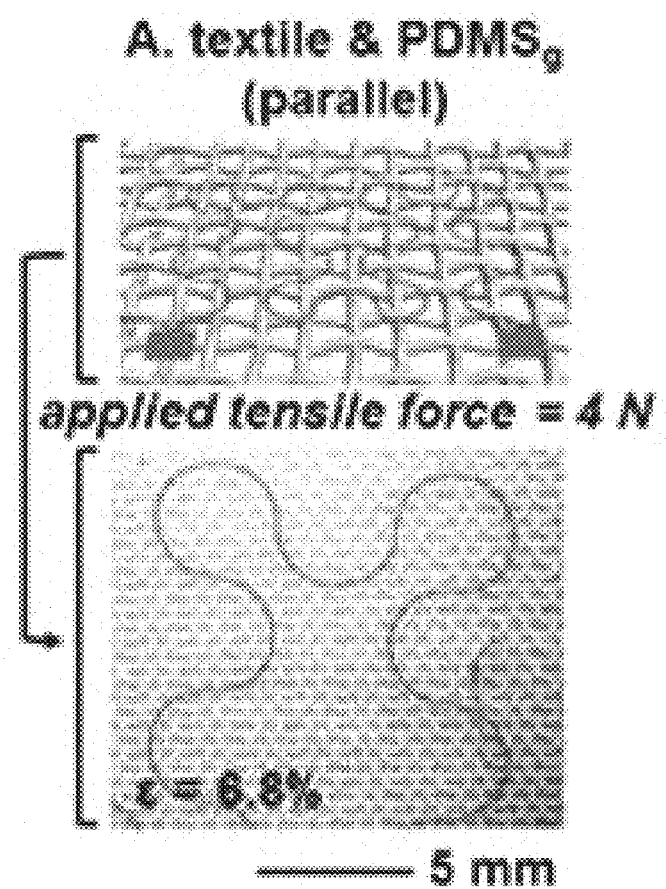
FIGS. 13A to 13D show a schematic diagram for four different samples manufactured in Experimental Example 1 on which a polymer substrate including electrodes is transferred onto textiles with (A) parallel alignment, (B) diagonal alignment, (C) diagonal alignment followed by additional coverage of PDMS, and (D) only coverage of PDMS, and SEM images after applying tensile deformation to each of the samples, respectively.
Figure 13B:
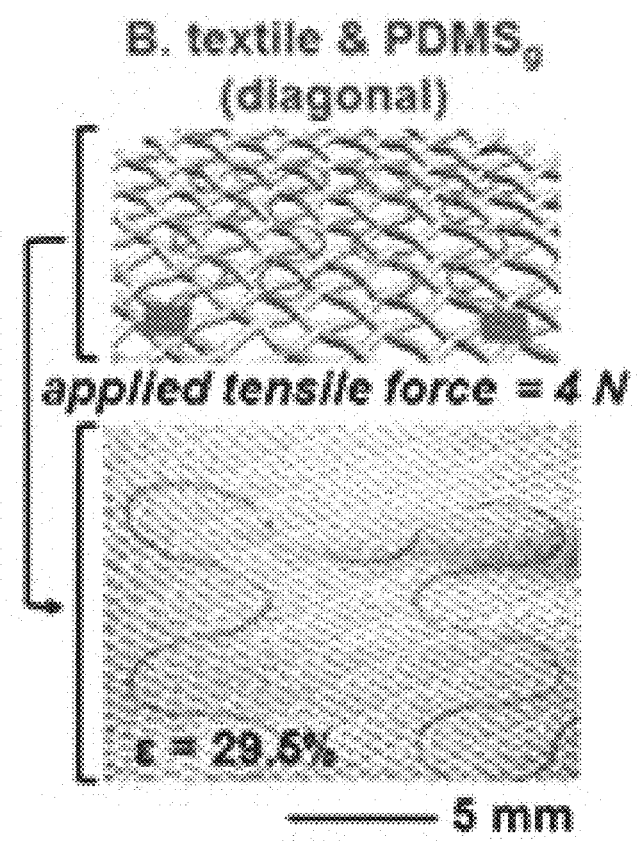
Figure 13C:
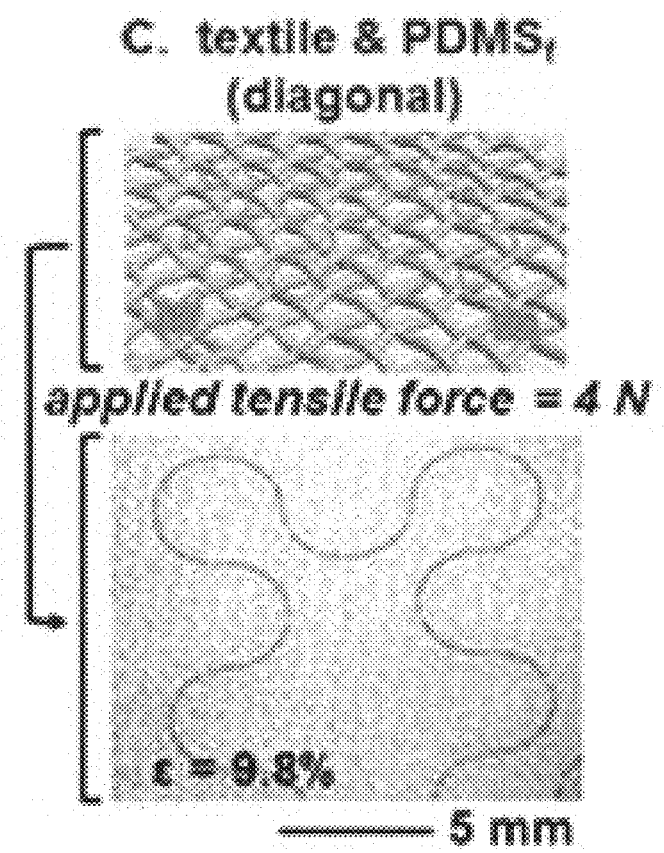
Figure 13D:
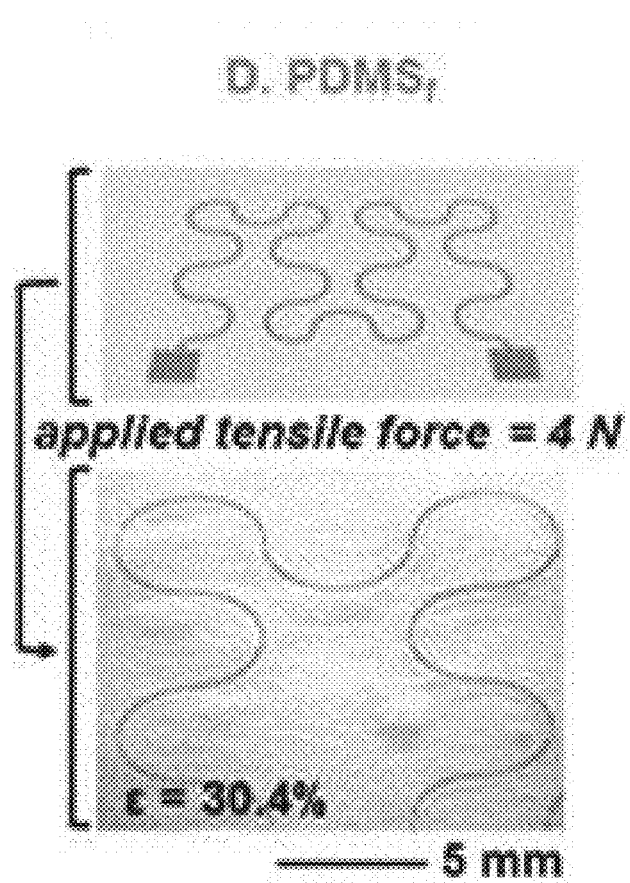
Figure 13E:
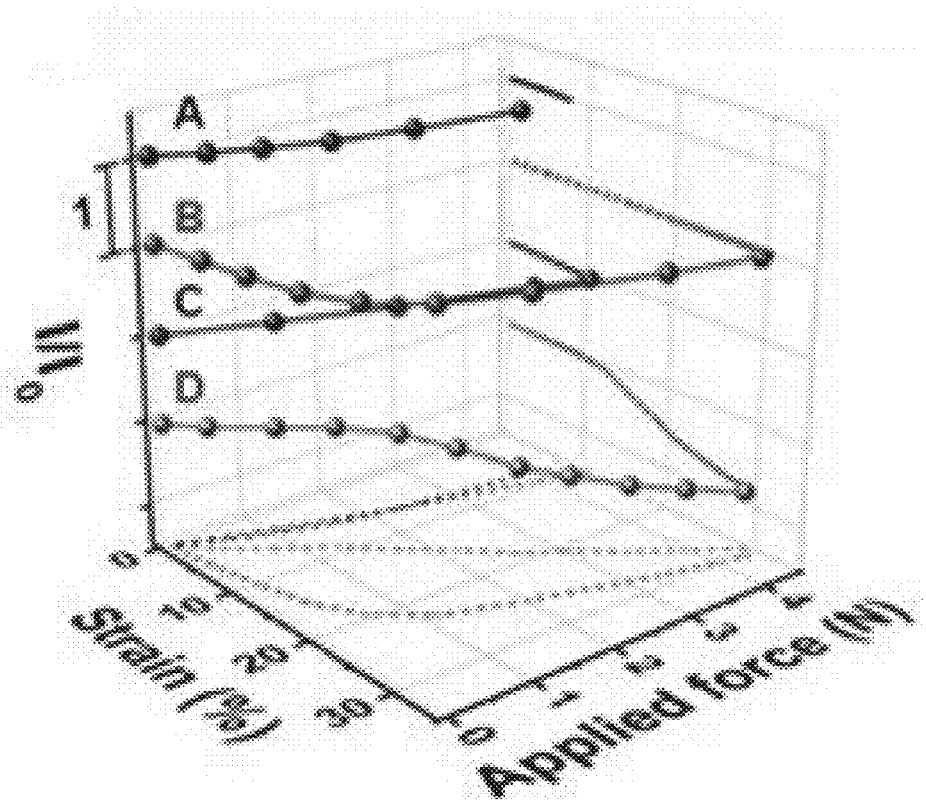
FIG. 13E shows a graph showing tensile strain and current change values under tensile stress for four different samples in FIGS. 13A to 13D.

FIG. 13E shows stress values when the tensile strains are applied and the current change values (I/I0) measured at the electrode in the case of A, B, C and D of FIGS. 13A to 13D. Here, I is a current value when tensile strain is applied and I0 is an initial current value before tensile strain. It can be observed that the stress according to tensile strain varies with the characteristics of each of the samples. In the case of current change values, A and B shows a small change of 3% and 4.6%, respectively, and 6% for C and 87% for D, respectively. In particular, when the electrode is covered only with PDMS, cracks in the electrode are maximized due to a pinning effect generated between the substrate and the cured PDMS.

Figure 13F:
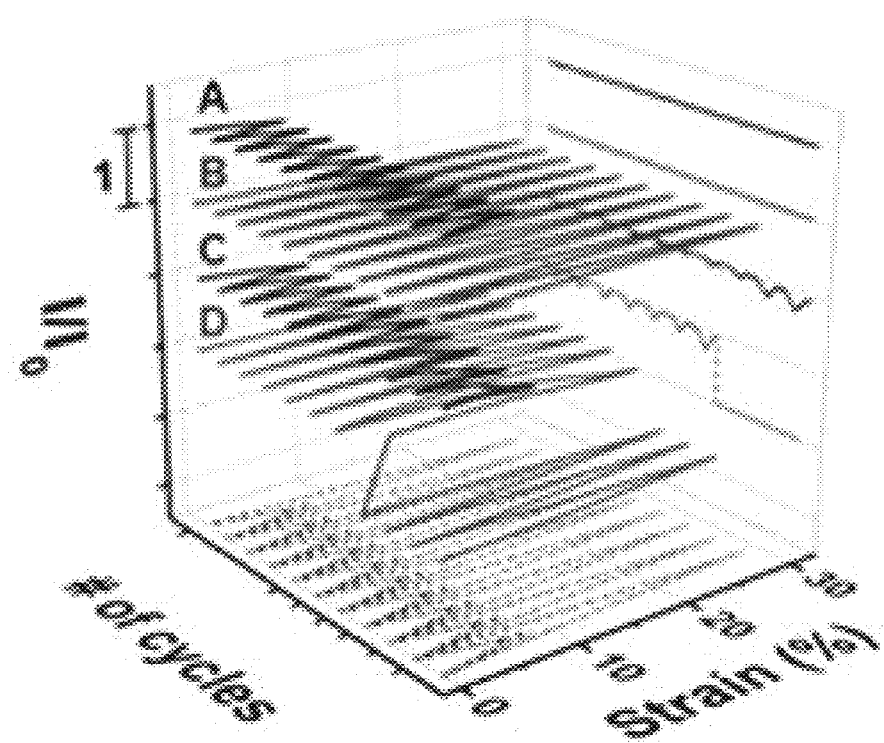
FIG. 13F shows a graph showing current change values upon repeated 1,000 cycles of tensile stress for four different samples in FIGS. 13A to 13D.

FIG. 13F shows changes in the current value when repeated tensile strain is applied up to 1000 times in the case of A, B, C, and D of FIGS. 13A to 13D. In the case of A and B, the changes in the current value were very small, 1.2% and 1.1%, respectively, while C was greatly reduced to 74%. In the case of D, it was confirmed that the electrode was broken in the 304th repeated measurement. In the case of C and D, it can be considered that a large tensile stress is generated due to a pinning effect between the PDMS and the polymer substrate including the electrode.

Figure 14:
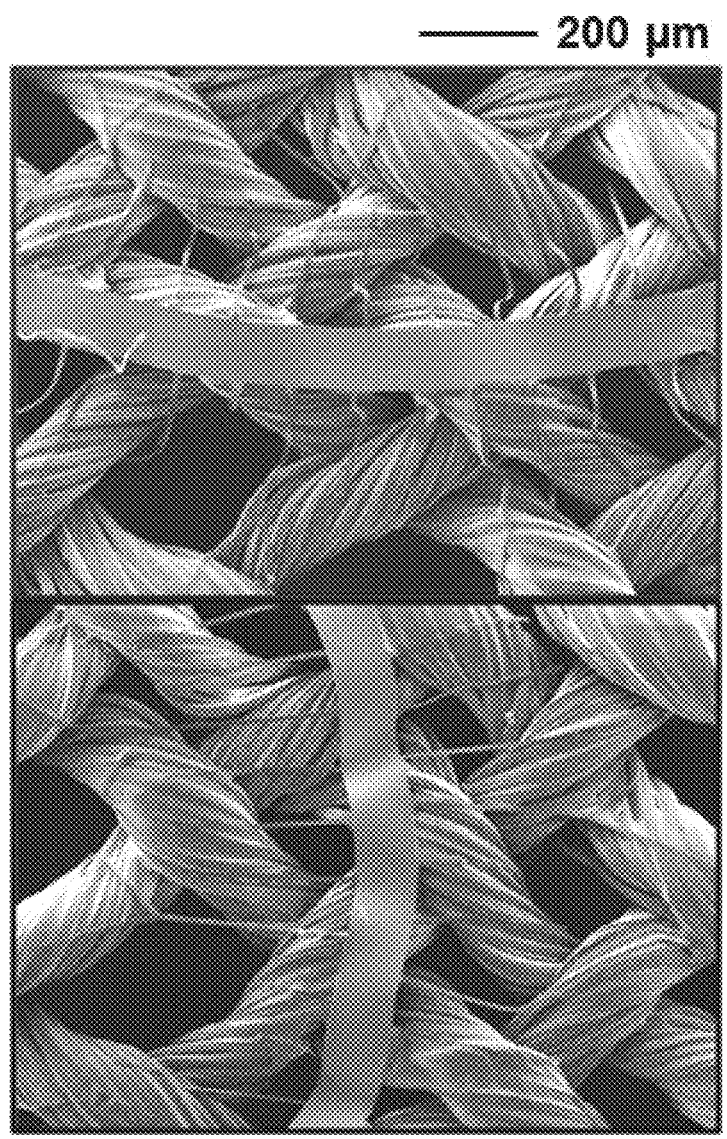
FIG. 14 shows SEM images for sample B in FIG. 13B.

FIG. 14 shows SEM images for a polymer substrate for transfer printing including electrodes transfer printed onto textiles. At this time, while about 10% of the tensile strain was applied to the textile, the transfer printing polymer substrate and the ciliary adhesive rods were simultaneously observed. Referring to the polymer substrate including the electrodes laid horizontally and the ciliary adhesive rods, it can be seen that when tensile deformation is applied to the textile in the transverse direction, shrinking deformation occurs in the up and down direction, and the ciliary adhesive rods lying opposite to the tensile strain direction are contracted with textiles and bent. In addition, it can be seen that the polymer substrate including the electrodes laid in the same direction as the tensile strain stretches as the wavy shape expands. In the case of the polymer substrate including electrodes laid in the transverse direction and the ciliary adhesive rods, it can be seen from the SEM images that the ciliary adhesive rods laid in the same direction as the tensile strain direction of the textiles are stretched by the same tensile stress. It was also confirmed that the ciliary adhesive rods were broken when subjected to severe tensile stress.

Therefore, in the case of the polymer substrate for transfer printing including the electrode, when the tensile stress is applied, the ciliary adhesive rods formed around the polymer substrate adheres to the thread strands with a large adhesive strength so that they can be maintained in their original position well, and at the same time the tensile stress applied thereto can be dispersed as a part of the polymer substrate connected with the ciliary adhesive rods or the ciliary adhesive rods rather than the polymer substrate and the electrode.

EXPERIMENTAL EXAMPLE 5

Applications of Electronic Textiles Using Transfer Printing Technology: Hot Wire Using the methods of Experimental Examples 1 and 4, a polymer substrate for transfer printing including an electrode transfer printed in a diagonal direction as shown in FIG. 13E was prepared.

Figure 15A:
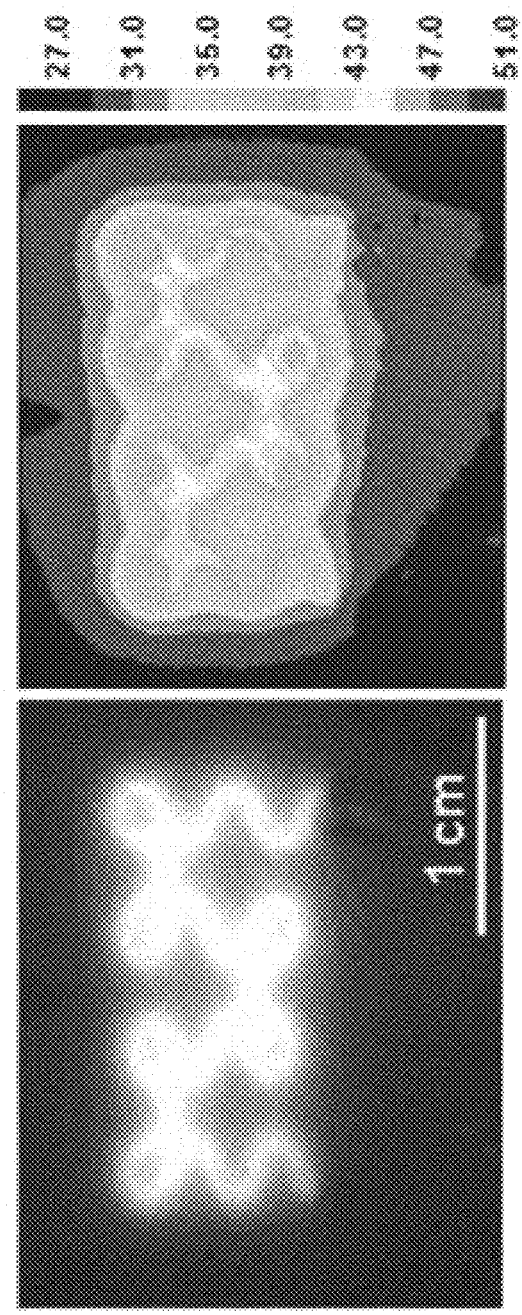

FIG. 15A shows photographs of the heat generated in the electrode when the DC 15 V is applied to the electrode through an infrared thermal imaging camera, and the temperature distribution at that time. It is observed that the temperature increases up to about 45° C. along the hot wire. FIG. 15B shows photographs showing the application of the tensile strain in the state of applying DC 15V and the temperature distribution at that time.

It can be seen that due to the deformation of the electrodes, some resistance may rise and thereby the temperature may increase to about 51° C.

EXPERIMENTAL EXAMPLE 6

Electronic Textile Applications Using a Transfer Printing Technique: 7-Stage Ring Oscillator After the formation of the protective layer, the polymer substrate was coated, and $SiO_2$ was formed as a buffer layer by PECVD to a thickness of about 100 nm, in a similar manner as Experimental Example 1, which is intended to alleviate the thermal expansion coefficient difference between the inorganic thin film and the polymer substrate in the subsequent process.

First, 5 nm Cr and 70 nm Au were deposited on the polymer substrate, which was applied on the buffer layer, to manufacture a connection line for connecting the electrodes later. Then, molybdenum was deposited to 70 nm on a gate electrode of the transistor in each inverter and 150 nm of $SiO_2$ was deposited thereon by PECVD as a gate insulating film. IGZO (Indium Gallium Zinc Oxide), a semiconductor material, was formed thereon in a thickness of 15 nm as a channel, and heat treatment was performed at 300° C. for 2 hours. The source, drain and external electrode lines were then formed by depositing Cr and Au at 5 nm and 150 nm, respectively, at one time. After that, metal electrodes for grounding were also deposited with 5 nm Cr and 150 nm Au, respectively. After forming 100 nm with SU-8 diluted with a protective layer to protect the IGZO channel, polyimide was applied again.

The subsequent procedures were carried out in the same manner as in Experimental Example 1.

Figure 16A:
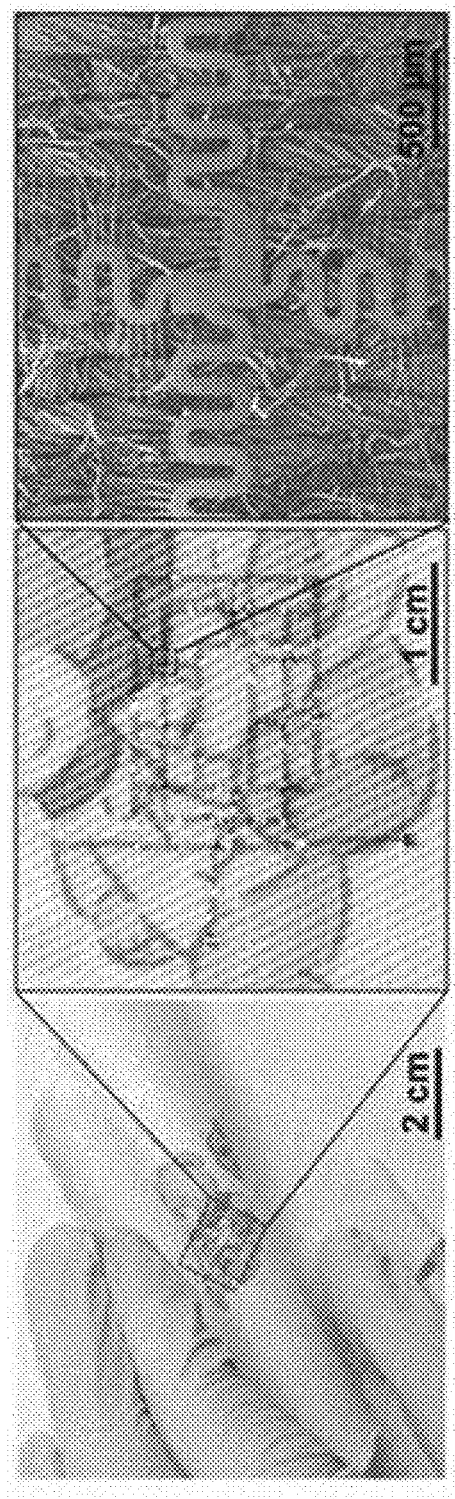
FIG. 16A shows photographs and SEM images of a 7-stage ring oscillator transferred onto a textile according to Experimental Examples 1 and 6.

FIGS. 16A shows a photograph in which the completed ring oscillator is transfer printed onto a patterned textile, and an enlarged photograph only for a device part. FIG. 16A also shows an enlarged SEM image for an inverter element in the ring oscillator.

Figure 16B:
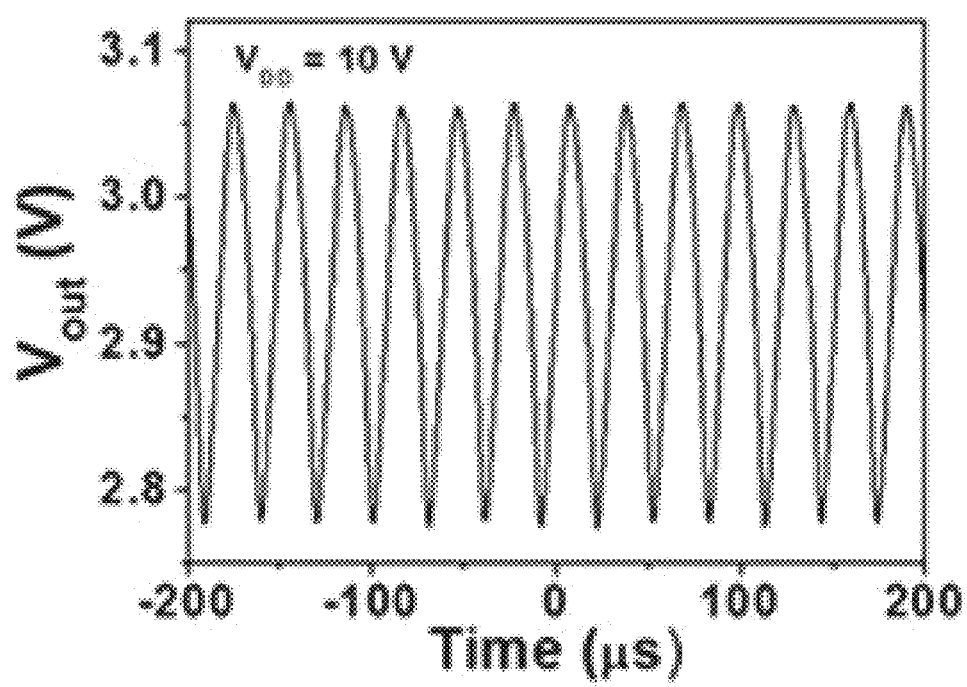
FIGS. 16B to 16E show graphs illustrating basic operating characteristics of a ring oscillator transferred onto a textile, and performance changes upon tensile deformation and after repeated tensile deformation, respectively.
Figure 16C:
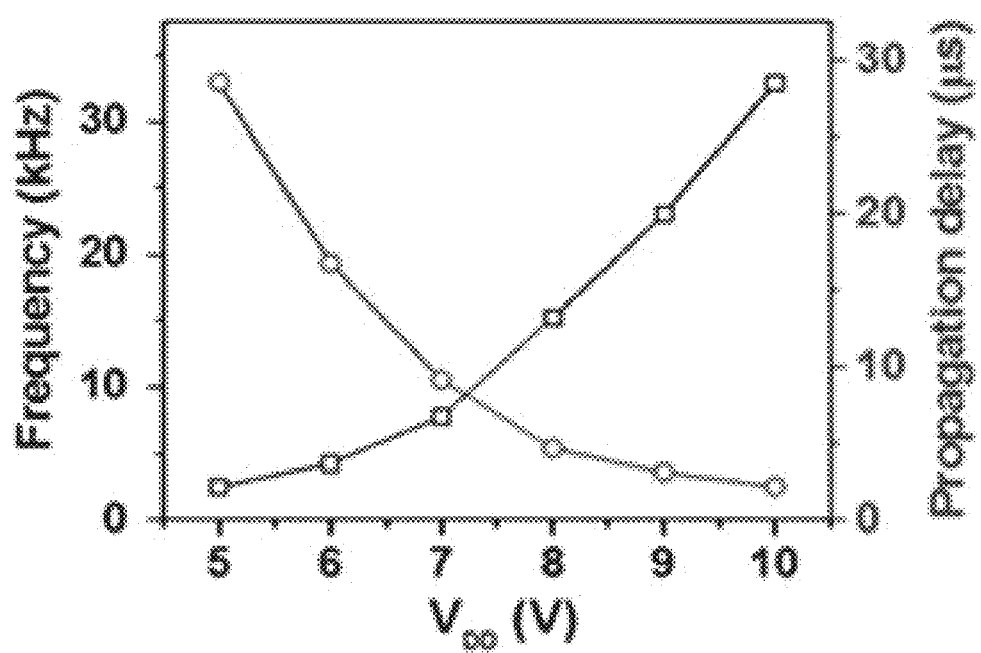

FIG. 16B shows a graph illustrating an output voltage over time for a device that is transfer printed onto a textile. FIG. 16B shows that oscillation occurs periodically when VDD is applied at 10V. Further, as shown in FIG. 16C, as the VDD increases, the output voltage oscillation frequency increases, and the propagation delay tends to decrease accordingly.

Figure 16D:
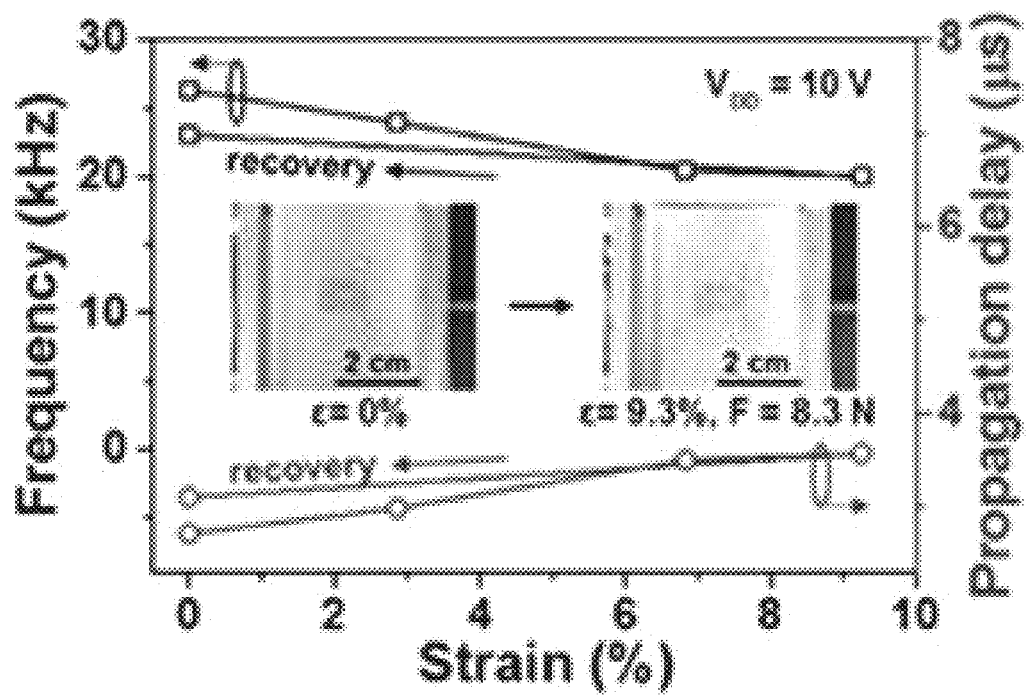
Figure 16E:
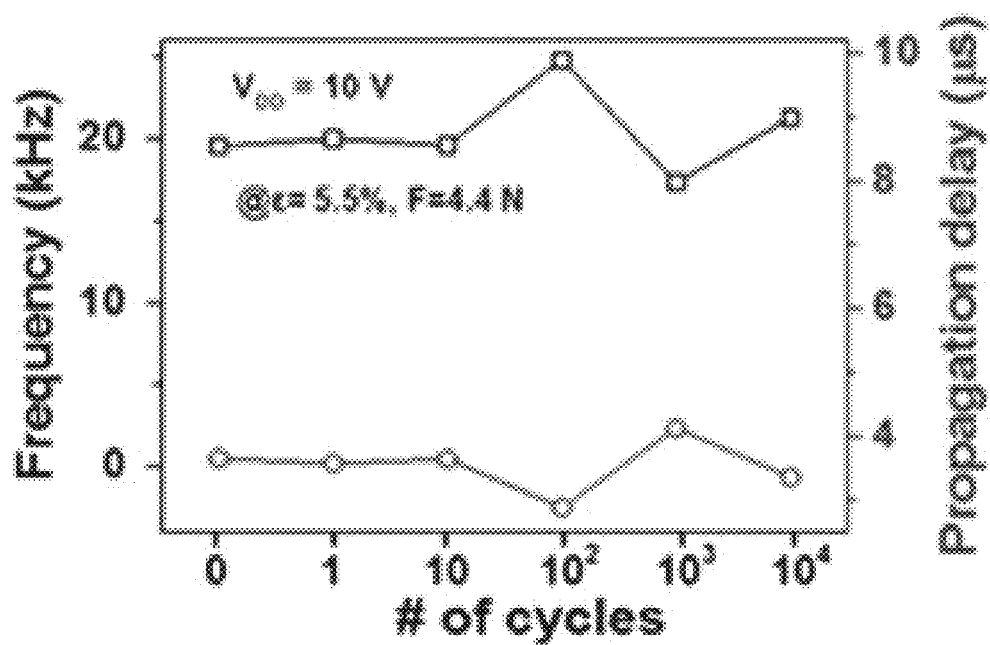

FIG. 16D shows a tensile test in order to show stability against mechanical deformation of a device that has been transfer printed onto a textile. When the tensile strain was increased to about 9.3%, the tensile stress was about 8.3 N. At this time, the oscillation frequency was slightly decreased and the propagation delay was increased accordingly. Further, it can be seen that when the device was restored to its initial state, the oscillation frequency was slightly reduced and the propagation delay was increased. However, it is confirmed that there is no problem in the operation of the device. FIG. 16E shows the behavior of the device when repeatedly applying a constant tensile strain. When 5.5% (tensile stress: 4.4 N) of the tensile strain was applied repeatedly about 10,000 times, there was a slight increase and decrease in the oscillation frequency and propagation delay of the device, but no breakage or defect of the device occurred.

In particular, when tensile strain was applied to a device, defects may occur between the electrode portion of the device and the external contact electrode made of silver paste, which may affect the performance of the device.

The present disclosure described above may be variously substituted, altered, and modified by those skilled in the art to which the present invention pertains without departing from the scope and sprit of the present disclosure. Therefore, the present disclosure is not limited to the above-mentioned exemplary embodiments and the accompanying drawings.

What is claimed is:

1. A method for transfer printing of an electronic device comprising:
    forming a sacrificial layer on a handling substrate;
    forming a protective layer on the sacrificial layer;
    forming a polymer substrate on the protective layer;
    forming a pattern on the polymer substrate, and forming a ciliary adhesive rod on the sides of the polymer substrate;
    forming a supportive layer on the polymer substrate on which the adhesive rod is formed; and
    removing the sacrificial layer and the protective layer, and turning over and transfer printing the electronic device onto an object to-be-printed, while dissolving the supportive layer.

2. The method for transfer printing of an electronic device according to claim 1, wherein the handling substrate is a glass or silicon substrate.

3. The method for transfer printing of an electronic device according to claim 1, wherein the sacrificial layer comprises a germanium oxide (GeOx) that is water soluble.

4. The method for transfer printing of an electronic device according to claim 1, wherein the protective layer comprises any one selected from a silicon oxide film, a thin metal film, and a polymer thin film, that is water insoluble.

5. The method for transfer printing of an electronic device according to claim 1, wherein the polymer substrate comprises any one selected from a polyimide, a polyethylene terephthalate (PET), a polyether sulfone (PES), a polystyrene (PS), a polycarbonate (PC), a polyethylene naphthalate (PEN), a polyarylate (PAR), and SU-8 polymer.

6. The method for transfer printing of an electronic device according to claim 1, wherein the ciliary adhesive rod is a straight or Y-shaped thin film.

7. The method for transfer printing of an electronic device according to claim 1, wherein the supportive layer comprises a polymethyl methacrylate (PMMA).

8. The method for transfer printing of an electronic device according to claim 1, wherein the transfer printing is conducted by introducing an adhesive solution of an adhesive mixed in an organic solvent.

9. The method for transfer printing of an electronic device according to claim 8, wherein the organic solvent is a toluene, an acetone, or a hexane, and the adhesive is a polydimethylsiloxane (PDMS) or polymethyl methacrylate (PMMA).

* * * * *